United States Patent
Kudo

(10) Patent No.: US 6,549,267 B1
(45) Date of Patent: Apr. 15, 2003

(54) PULSE-WIDTH EXTENDING OPTICAL SYSTEMS, PROJECTION-EXPOSURE APPARATUS COMPRISING SAME, AND MANUFACTURING METHODS USING SAME

(75) Inventor: Yuji Kudo, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/455,271

(22) Filed: Dec. 6, 1999

Related U.S. Application Data

(63) Continuation of application No. 08/802,951, filed on Feb. 21, 1997.

(30) Foreign Application Priority Data

Feb. 22, 1996 (JP) ................................. 8-059970

(51) Int. Cl.$^7$ .................... G03B 27/42; G03B 27/32; H01S 3/10; H01S 3/00
(52) U.S. Cl. .................... 355/53; 355/77; 372/25; 372/700
(58) Field of Search ................ 355/53, 44, 45, 355/77; 353/122; 362/3, 268; 430/30; 250/492.2; 385/14, 16; 372/22, 25, 700

(56) References Cited

U.S. PATENT DOCUMENTS

| | | |
|---|---|---|
| 4,619,508 A | 10/1986 | Shibuya et al. |
| 5,153,773 A | 10/1992 | Muraki et al. |
| 5,233,460 A | 8/1993 | Partlo et al. |
| 5,312,396 A | 5/1994 | Feld et al. |
| 5,315,604 A * | 5/1994 | Chiu et al. ................ 372/25 |
| 5,710,845 A | 1/1998 | Tajima |
| 5,754,573 A * | 5/1998 | Yarborough et al. ......... 372/22 |
| 5,760,408 A | 6/1998 | Kikuchi et al. |

FOREIGN PATENT DOCUMENTS

| | | |
|---|---|---|
| JP | 1-198759 | 8/1989 |
| JP | 1-287924 | 11/1989 |
| JP | 6-29177 | 2/1994 |
| JP | 2-2590530 | 12/1996 |
| JP | 9-17725 | 1/1997 |

* cited by examiner

*Primary Examiner*—Russell Adams
*Assistant Examiner*—Peter Kim
(74) *Attorney, Agent, or Firm*—Oliff & Berridge, PLC

(57) ABSTRACT

This invention pertains to systems for extending the pulse length of pulsed sources of optical radiation. These systems reduce peak optical pulse power without reducing average optical power. The pulse-width extending systems split optical pulses into pulse portions, introduce relative delays among the pulse portions, and then redirect the pulse portions (or portions thereof) along a common axis. Such pulse-width extending systems are especially useful in projection-exposure apparatus for the manufacture of semiconductor devices where short wavelength, high power optical sources tend to damage optical components.

109 Claims, 9 Drawing Sheets

PULSE-WIDTH EXTENDING OPTICAL SYSTEMS, PROJECTION-EXPOSURE APPARATUS COMPRISING SAME, AND MANUFACTURING METHODS USING SAME

This is a continuation of U.S. application Ser. No. 08/802,951, filed Feb. 21, 1997, which is incorporated herein by reference.

FIELD OF THE INVENTION

This invention pertains to pulse-width extending optical systems and a projection-exposure apparatus using such optical systems. More specifically, the invention pertains to optical systems that extend the duration of light pulses emitted by a pulsed laser, and to projection-exposure apparatus using such optical systems. The invention also pertains to methods for manufacturing semiconductor devices using such projection-exposure apparatus.

BACKGROUND OF THE INVENTION

FIG. 16 is a block diagram of a conventional microlithography projection-exposure apparatus comprising a pulsed laser. This projection-exposure apparatus comprises a laser 1 that emits light pulses. A beam-shaping optical system 2 shapes the cross section of the beam. The beam then enters a fly-eye lens 3. The fly-eye lens 3 divides the incident laser beam into multiple secondary light sources, one such secondary light source being formed at the rear focal point of the fly-eye lens 3. An aperture 4 limits the beam, and a condenser lens 5 uniformly illuminates a mask 6 with the beam. Typically the mask 6 contains a high-resolution pattern with extremely small features, e.g., patterns for semiconductor integrated circuits. A projection optical system 7 projects the pattern of the mask 6 on a wafer 8. The projected pattern may be either demagnified (reduced) or magnified (enlarged).

The resolution of the pattern of the mask 6 as projected on the wafer 8 depends on the wavelength of the light from the laser 1. The laser 1 emits light having as short a wavelength as possible in order to form high-resolution patterns on the wafer 8.

Many lasers emitting short wavelengths of light emit pulses of light. The peak optical powers and intensities of pulsed lasers are very much larger than their average optical powers. (Optical power is defined as optical energy per unit time; optical intensity is optical power per unit area.) For example, for an ArF excimer laser which emits light at a wavelength of 193 nm and which has a beam cross section of 20 mm by 5 mm, typical peak pulse intensities during pulses are on the order of 10 MW/cm$^2$.

Short-wavelength radiation tends to cause changes in optical materials. These changes include increased absorption by the materials and radiation-induced changes in refractive index. These changes are frequently irreversible. In addition, such changes are more readily produced by high power and high-intensity radiation in comparison with radiation of similar average power but lesser peak values. For this reason, systems using short-wavelength lasers often suffer from radiation-induced changes to their optical elements.

Conventional projection-exposure apparatus using short-wavelength lasers also exhibit astigmatism caused by variations in the refractive indices of the lens material of the projection optical system. Such astigmatism significantly degrades the resolution of the projection optical systems.

For example, the ArF excimer laser (emission wavelength of 193 nm) is a suitable short-wavelength laser. Only a few refractive optical materials are appropriate for use in optical systems with this short wavelength. The most commonly used materials are synthetic fused quartz and fluorite. Both of these materials show a gradual decline in transmissivity when irradiated by light of intensities greater than certain threshold intensities. In order to prevent a decline in transmissivity, the optical systems of projection-exposure apparatus frequently enlarge the diameter of the light beam so as to reduce the intensity of optical pulses on the lenses.

SUMMARY OF THE INVENTION

This invention provides pulse-width extending optical systems, projection-exposure apparatus comprising such systems, and manufacturing methods using such projection-exposure apparatus. The pulse-width extending systems lower laser peak powers in the optical system without reducing average laser power. For convenience, optical pulse width is defined as the time during which an optical pulse has an intensity greater than one-half of the maximum value of the intensity. It is also convenient to define an optical pulse length as the distance traveled by an optical pulse in a time equal to its pulse width.

In a preferred embodiment of a pulse-width extending optical system according to the invention, a beamsplitter splits an incident laser pulse into two or more pulses. The pulses propagate along optical paths such that they are delayed with respect to each other. A beamsplitter then receives the delayed pulses and directs them along a common output optical path. In the example embodiments, one or more beamsplitters split and combine the pulses.

Because the split pulses are delayed, the peak power at the output is reduced because optical pulse energy from the original pulse arrives over a time period that is longer than the original pulse duration. The delay among the pulses is set by causing the split pulses to travel different optical paths. To effectively reduce the laser power, the optical path differences are preferably greater than the pulse length.

Pulse-width extending optical systems according to the invention also preferably comprise relay systems operable to ensure that the delayed pulses maintain appropriate beam cross-sections and do not become large because of the natural divergence of light beams. The relay systems provide an additional benefit. If a relay system inverts a beam image, then beam uniformity is improved because the relay system overlaps a beam and an inverted image.

According to another aspect of the present invention, projection-exposure apparatus are provided comprising pulse-width extending optical systems as summarized above. In such a projection-exposure apparatus, the pulse-width extended radiation is directed to a multi-source image mechanism to form multiple images of the pulse-width extended radiation. A condenser then illuminates the mask substantially uniformly using the multi-source images. This projection-exposure apparatus can be advantageously used for manufacturing semiconductor devices.

The foregoing and other objects, features, and advantages of the invention will become more apparent from the following detailed description of the example embodiments which proceeds with reference to the accompanying drawings.

BRIEF DESCRIPTION OF THE DIAGRAMS

DETAILED DESCRIPTION OF PREFERRED EMBODIMENTS

The duration of a light pulse can be increased by splitting it into multiple sub-pulses, causing the sub-pulses to propagate differing distances thereby acquiring differing delays, and then directing the sub-pulses back along a common axis. By increasing the duration of the pulse, the peak pulse power decreases. If pulse splitting and recombining introduces insignificant optical loss, then the recombined pulses have approximately the same total energy as the initial light pulse. Thus, the average optical power is unchanged, but the peak power decreases. By decreasing the peak optical power, optical-material degradation caused by high powers is reduced. This is especially important for projection-exposure apparatus utilizing pulsed lasers where optical-material degradation degrades the performance of the projection optical system in such an apparatus.

Figure 1:
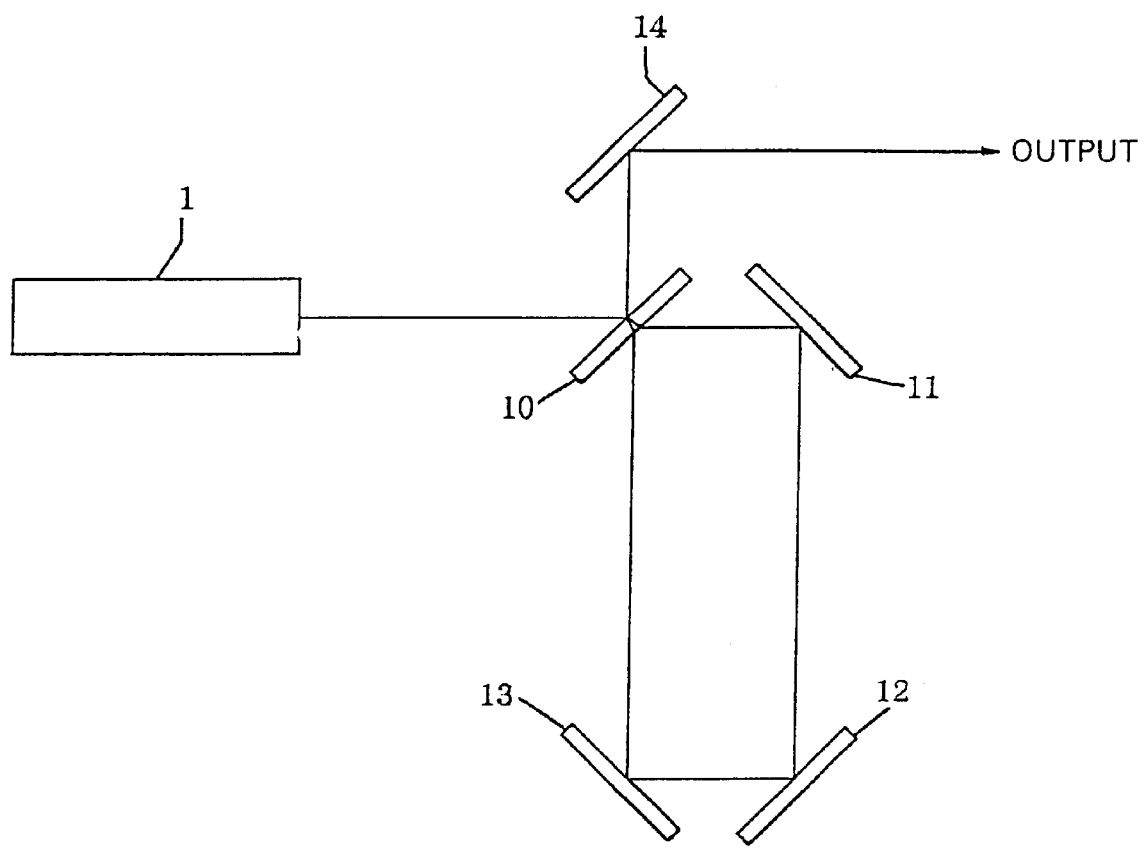
FIG. 1 is an optical block diagram of a pulse-width extending optical system according to a first example embodiment of the invention.
Figure 2:
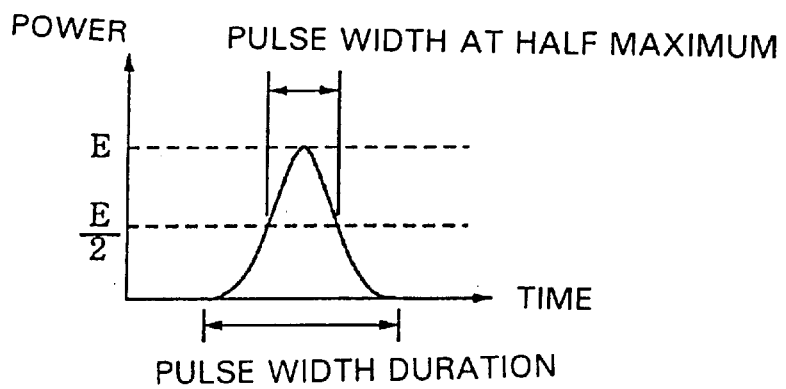
FIG. 2 is a plot of laser power as a function of time for the laser of the pulse-width extending optical system of FIG. 1.

FIG. 1 is an optical block diagram of a pulse-width extending optical system according to a first example embodiment. FIG. 2 shows a representative plot of the intensity, as a function of time, of the laser pulses as emitted by the laser 1 of the FIG. 1 embodiment.

The pulse-width extending optical system of FIG. 1 comprises a laser 1 that emits pulses of nearly linearly polarized light. The polarization orientation of the pulses emitted by the laser 1 is either perpendicular or parallel to the plane of the page of FIG. 1.

A light pulse emitted by the laser 1 strikes a dielectric beamsplitter 10, which has a partially transmitting, dielectric multi-layer coating. The dielectric beamsplitter 10 divides the laser pulse into a first output pulse that is reflected by the dielectric beamsplitter 10, and a first circulating pulse that is transmitted through the dielectric beamsplitter 10. The first output pulse from the dielectric beamsplitter 10 then strikes a mirror 14 that directs the pulse to an output. The first circulating pulse is transmitted by the dielectric beamsplitter 10 and is then reflected sequentially by mirrors 11, 12, 13 before returning to the dielectric beamsplitter 10. The mirrors 11, 12, 13 and the dielectric beamsplitter form a circulating optical path ("circulator") for the circulating pulse.

The dielectric beamsplitter 10 then divides the returning pulse into a second output pulse and a second circulating pulse. The second output pulse is the portion of the first circulating pulse that is transmitted through the dielectric beamsplitter 10. The mirror 14 reflects the second output pulse to an output. The first circulating pulse is partially reflected by the dielectric beamsplitter 10, forming the second circulating pulse. The second circulating pulse follows the same optical path as the first circulating pulse. The mirrors 11, 12, 13 sequentially reflect the second circulating pulse and return it to the dielectric beamsplitter 10.

The dielectric beamsplitter 10 once again divides the returning pulse into a third output pulse and a third circulating pulse. The third output pulse follows the optical path of the second output pulse and the first output pulse; the mirror 14 reflects this pulse to an output. The third circulating pulse similarly follows the optical path of the first and second circulating pulses. The mirrors 11, 12, 13 reflect the third circulating pulse and redirect it to the dielectric beamsplitter 10. The dielectric beamsplitter 10 once again divides the returning pulse in the same way as the prior circulating pulses were divided.

In this way, pulses circulate along the circulating optical path, from mirror 11 to mirror 12 to mirror 13 and back to the dielectric beamsplitter 10. The dielectric beamsplitter 10 transmits a portion of the circulating pulse so the successive circulating pulses decrease in power. The output pulses are all directed along substantially the same axis as the first output pulse. Therefore, downstream optical systems at the output will redirect all output pulses in same way. If the mirrors 11, 12, 13 and the dielectric beamsplitter 10 are perfect (i.e., exhibit no loss of light energy reflecting therefrom), then all of the light emitted by the laser 1 is eventually reflected to the output by the mirror 14.

The dielectric beamsplitter 10 thus splits a single incident laser pulse into multiple pulses that travel differing distances. The dielectric beamsplitter 10 also recombines the multiple pulses and directs them in a single direction. The circulating optical path of the circulator is formed by the disposition of the three mirrors 11, 12, 13 so as to provide a predetermined optical-path-length difference or form a pulse-delay optical path. The mirrors 11, 12, 13 have the function of an optical system that provides an optical-path-length difference or forms a pulse-delay optical system.

Figure 3:
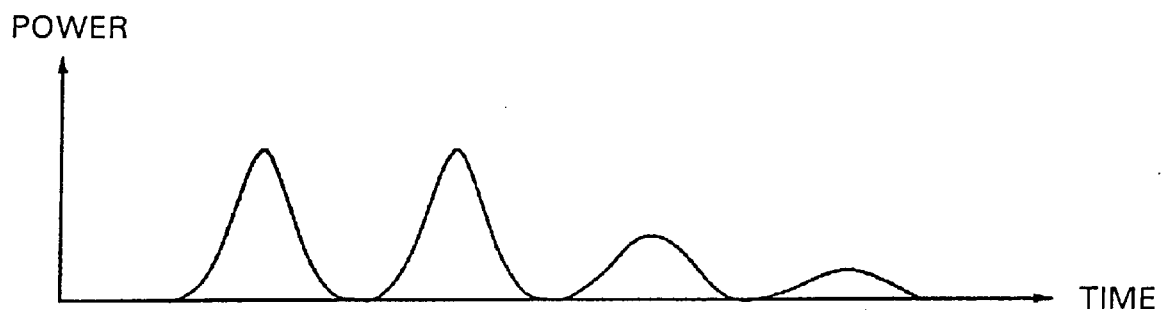
FIG. 3 is a plot of laser power as a function of time for multiple split laser pulses without temporal overlap.

If the pulse width of the pulses from the laser 1 is δ (sec), then the pulse travels a distance ("pulse length") during a time equal to the pulse width of $3 \times 10^8 \times \delta$ [m], wherein it is assumed that the pulse travels in a medium having a refractive index n=1. If the optical path length of the circulator (i.e., the dielectric beamsplitter 10 and the mirrors 11, 12, 13) is longer than the pulse length, then the pulses delivered to the mirror 14 through the dielectric beamsplitter 10 will have no temporal overlap. FIG. 3 shows the output-pulse power as a function of time for a circulator in which the output pulses have no temporal overlap.

For example, if the pulse width δ is 10 nsec, the pulse length is 3 m. If the optical path length of the circulator is greater than 3 m, then the recombined pulses have no temporal overlap. FIG. 3 shows that the circulator extends the optical pulse width and the optical power (energy per unit of time) is significantly reduced.

Even if the optical path length of the circulator is less than or equal to the pulse length, if each pulse is sufficiently delayed or advanced with respect to other pulses, then the peak power of the recombined beam is still smaller than the peak power of the original laser pulse entering the circulator. The peak optical power can be effectively reduced by setting the optical path difference to half the pulse length. As shown in FIG. 2, the pulse width is defined as the time during which the pulse has a power greater than one-half of its peak power. The half-pulse length is the distance light travels during a time equal to one-half pulse width.

Figure 4:
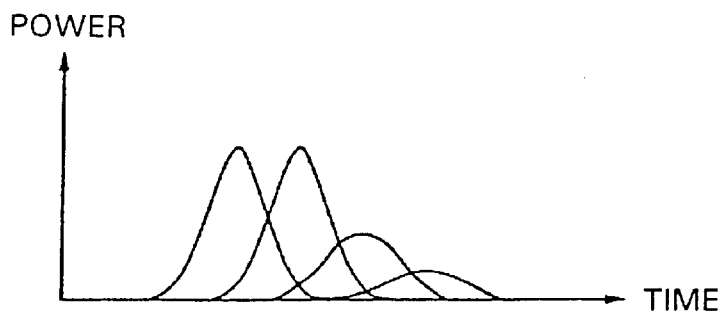
FIG. 4 is a plot of power as a function of time for multiple split pulses in which the optical path delay is one-half the laser pulse-width.

FIG. 4 shows optical power as a function of time for a series of pulses exiting the circulator when the optical path length is one-half of the pulse length. FIG. 4 shows that the peak power of each pulse occurs at times for which the peak powers of adjacent pulses have fallen to less than one-half of their peak values. This demonstrates that, even when the optical path is equal to one-half the pulse length, the optical power is significantly reduced.

The power in each pulse formed by the dielectric beamsplitter 10 depends on the reflectivity of the dielectric beamsplitter 10. The beamsplitter 10 has a dielectric multi-layer film that is partially transmitting; absorption and other losses in the beamsplitter are negligible. If R is the reflectivity of the dielectric beamsplitter 10, then transmissivity T is T=1−R. The optical power of each pulse is found using the following equations:

$$E_1 = E \cdot R \quad (1)$$

$$E_2 = E \cdot (1-R) \cdot (1-R) \quad (2)$$

$$E_3 = E \cdot (1-R) \cdot R \cdot (1-R) \quad (3)$$

$$E_n = E \cdot (1-R) \cdot R^{n-2} \cdot (1-R) \quad (4)$$

wherein E is the power of the pulse emitted by the laser; $E_1$ is the power of the first output pulse; $E_2$ is the power of the second output pulse formed by transmission of the first circulating pulse through the beamsplitter; $E_3$ is the power of the third output pulse formed by transmission of the second circulating pulse through the beamsplitter; $E_n$ is the power of the nth output pulse formed by transmission of the (n−1)th circulating pulse.

As shown in FIGS. 3 and 4, the powers of the first and second output pulses are the largest. As is apparent from the foregoing equations (1)–(4), the relative magnitudes of the pulses depend on the reflectivity of the beamsplitter 10. In order to minimize the maximum optical power of the combined pulses, the reflectivity R of the dielectric beamsplitter 10 should be chosen so that $E_1$ (the power of the first output pulse) and $E_2$ (the power of the second output pulse) are nearly equal. Using the foregoing equations (1)–(4), the reflectivity R is determined by the following equation:

$$E \cdot R = E \cdot (1-R) \cdot (1-R)$$

Therefore, the reflectivity R of the dielectric beamsplitter 10 should be about 38.2 percent. With this value of reflectivity R, the ratio of E (the power of the pulse emitted by the laser) to $E_n$ (the power in the nth output pulse) is given by the following equations:

| first output pulse | $E_1/E = 38.2\%$ | (5) |
| second output pulse | $E_2/E = 38.2\%$ | (6) |
| third output pulse | $E_3/E = 14.6\%$ | (7) |
| fourth output pulse | $E_4/E = 05.6\%$ | (8) |
| fifth output pulse | $E_5/E = 02.1\%$ | (9) |

It is difficult to keep the powers of the first and second pulses exactly equal because the reflectivity R will generally vary slightly from the ideal value due to manufacturing errors. If the pulse powers are chosen so that the first and second output pulses have powers less than 50 percent of the power of the original laser pulse, then the reflectivity R can have a broad range of values. Using the foregoing equations (1)–(4) and setting both $E_1$ and $E_2$ to be less than 50 percent of E, the reflectivity R must satisfy the following conditions:

$$E \cdot R < 0.5 E \quad (10)$$

$$E \cdot (1-R) \cdot (1-R) < 0.5 E \quad (11)$$

These inequalities are readily solved to find the appropriate range of values for the reflectivity R of the dielectric beamsplitter 10:

$$29.3\% < R < 50\% \quad (12)$$

Furthermore, in the first example embodiment, the laser pulses were assumed to be linearly polarized light, but they could be unpolarized, circularly polarized, or randomly polarized light. However, in these cases, the reflectivity of the dielectric beamsplitter 10 should be the same for all polarizations. For example, the reflectivity for both s-polarization and p-polarization should be equal.

However, even if the s-polarization and p-polarization reflectivities are different, a similar reduction in power is obtained if the average of these reflectivities satisfies the inequality (12). The relative percentage of s-polarization and p-polarization in the first pulse of light will differ from the percentage of s-polarization and p-polarization in the second pulse of light, but the optical power will be reduced.

Figure 5:
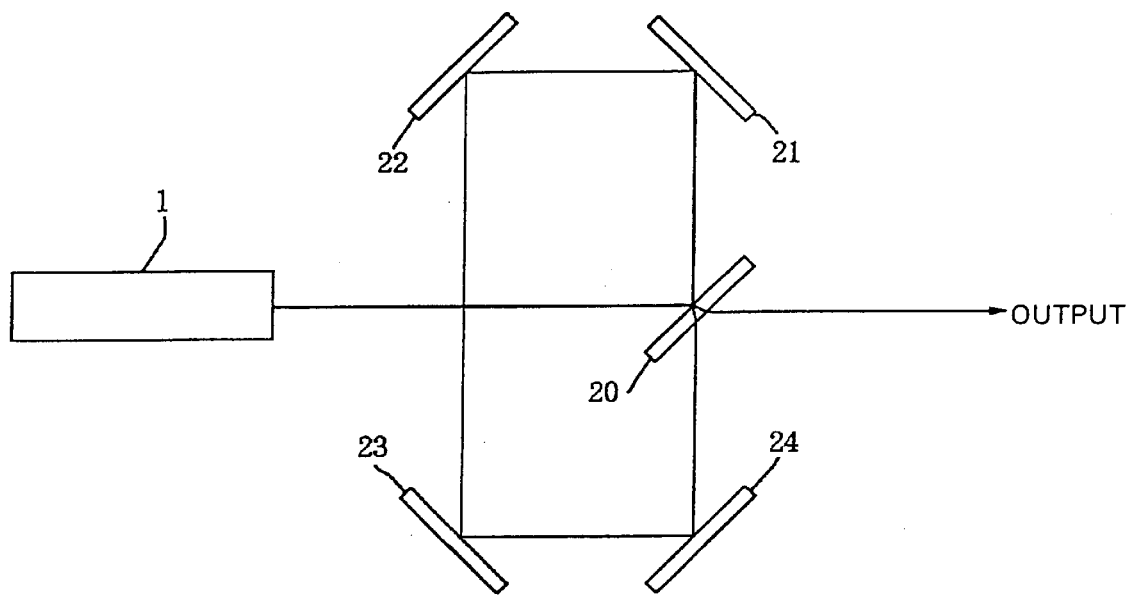
FIG. 5 is an optical block diagram of a pulse-width extending optical system according to a second example embodiment of the invention.

FIG. 5 shows a block diagram of a pulse-width extending optical system according to a second example embodiment of the invention. This embodiment is similar to the first example embodiment, but the action of the transmissivity and the reflectivity of the half mirror comprising the means for splitting light and the means for synthesizing light are reversed. The second example embodiment is explained below pointing out the differences with respect to the first example embodiment.

FIG. 5 shows certain features of the second example embodiment. A laser 1 emits a light pulse that strikes a dielectric beamsplitter 20 comprising a partially reflecting dielectric multi-layer film. The beamsplitter 20 splits the laser pulse into a first transmitted pulse and a first circulating pulse. The first transmitted pulse is output. The first circulating pulse is then sequentially reflected by mirrors 21, 22,

23, 24. The mirror 24 reflects the first circulating pulse to the dielectric beamsplitter 20.

The dielectric beamsplitter 20 then splits the first circulating pulse. The transmitted portion of the first circulating pulse becomes a second circulating pulse; the reflected portion is a second output pulse that is directed to the output. The second circulating pulse follows the same optical path as the first circulating pulse and is sequentially reflected by the mirrors 21, 22, 23, 24. The mirror 24 reflects the second circulating pulse to the dielectric beamsplitter 20.

The dielectric beamsplitter 20 then splits the second circulating pulse into a third output pulse and a third circulating pulse. The third output pulse is the portion of the second circulating pulse reflected by the dielectric beamsplitter 20; the third output pulse is directed to the output. The portion of the second circulating pulse transmitted by the beamsplitter 20 becomes the third circulating pulse. The third circulating pulse follows the same optical path as the first and second circulating pulses and returns to the dielectric beamsplitter 20.

The dielectric beamsplitter 20 again divides the circulating pulse into a fourth output pulse and a fourth circulating pulse. The fourth output pulse is reflected to the output; the fourth circulating pulse follow the same optical path as the other circulating pulses before returning to the beamsplitter 20.

As will be readily apparent, there are still more circulating pulses and output pulses than the four discussed above. The circulating optical path of the circulator is formed by the disposition of the four mirrors 21, 22, 23, 24 so as to provide a predetermined optical-path-length difference or form a pulse-delay optical path. The mirrors 21, 22, 23, 24 have the function of an optical system that provides an optical-path-length difference or forms a pulse-delay optical system. The magnitude of the output pulses decreases with every reflection by the dielectric beamsplitter 20 because reflection by the dielectric beamsplitter 20 directs a portion of each circulating pulse to the output. If the dielectric beamsplitter 20 exhibits no loss and the mirrors 21, 22, 23, 24 are perfect (i.e., 100-percent reflective), then the energy of the original laser pulse is delivered to the output without any loss.

In the second example embodiment, the action of the transmission and reflection of the dielectric beamsplitter 20 is opposite that of the first example embodiment. In the second example embodiment, the transmissivity T of the dielectric beamsplitter 20 needed to make the power of the first output pulse and the power of the second output pulse equal is equal to the reflectivity R of the dielectric beamsplitter 10 needed to make the powers of the first and second output pulses equal. Therefore, the transmissivity T of dielectric beamsplitter 20 is 38.2 percent.

Similarly, to make the power $E_1$ of the first output pulse and the power $E_2$ of the second pulse of light less than or equal to 50 percent of the power E of the original laser pulse, the transmissivity T of the dielectric beamsplitter 20 should satisfy the following condition:

$$29.3\% < T < 50\% \quad (13)$$

As in the first example embodiment, if the pulses of light from the laser 1 of the second example embodiment are unpolarized, circularly polarized, or randomly polarized, then approximately the same effect is achieved if the transmissivity averaged over the s- and p-polarizations satisfies condition (13), above.

Figure 6:
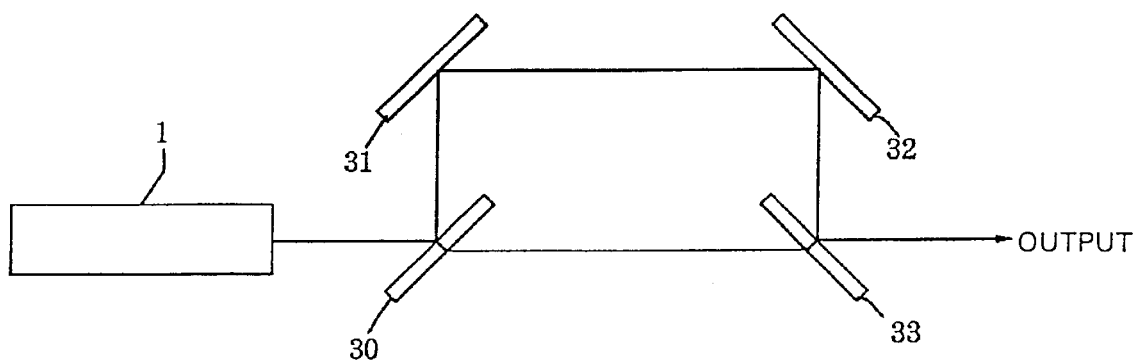
FIG. 6 is an optical block diagram of a pulse-width extending optical system according to a third example embodiment of the invention.

FIG. 6 shows a block diagram of a pulse-width extending optical system corresponding to a third example embodiment of the invention. In contrast to the first and second example embodiments in which a single beamsplitter both divides light pulses and directs multiple pulses to the output, the third example embodiment utilizes a first polarizing beamsplitter 30 for splitting light and a second polarizing beamsplitter 33 for directing light to an output. The third example embodiment is explained below while pointing out differences relative to the first and second example embodiments.

In the pulse-width extending optical system in FIG. 6, a light pulse emitted by the laser 1 is split into p-polarized and s-polarized components by the first polarizing beamsplitter 30. The first polarizing beamsplitter 30 completely transmits p-polarized light while completely reflecting s-polarized light. The p-polarized component of the pulse transmitted by the first polarizing beamsplitter 30 is also transmitted by the second polarizing beamsplitter 33 and is directed to the output. In contrast, the s-polarized component of the pulse is reflected by the first polarizing beamsplitter 30 and is then reflected sequentially by mirrors 31, 32 before reaching the second polarizing beamsplitter 33. The second polarizing beamsplitter 33 then reflects the s-polarized pulse portion to the output.

In this way, the first polarizing beamsplitter 30 serves to divide the input light pulse along two optical paths. The second polarizing beamsplitter 33 serves to recombine the beams and direct the recombined beam to the output.

The p-polarized and the s-polarized portions of the original laser pulse travel different optical paths. As stated above, if this optical path difference between the two portions is longer than the laser pulse length, then the two split pulses will have no temporal overlap at the output. Also, as noted above, even if the optical path difference is set to one-half the pulse length, the power at the output is significantly reduced.

Unlike the first and second example embodiments, the original laser pulse in the third example embodiment is split into two pulses and each of these pulses becomes one of only two output pulses. There is no series of output pulses obtained from a series of circulating pulses.

The third example embodiment splits input pulses that are either unpolarized, circularly polarized, or randomly polarized into two pulses having pulse powers that are approximately equal, each having 50 percent of the power of the input laser pulse.

If the original laser pulse is linearly or elliptically polarized, then the power in the p-polarized and s-polarized pulses will not generally be equal. It is desirable to arrange the polarization axis of the first polarizing beamsplitter 30 so that the powers of the pulses are nearly equal. If the original laser pulse is linearly polarized and its polarization orientation is either parallel or perpendicular to the plane of the page of FIG. 6, then it is desirable to orient the polarizing axis of the first polarizing beamsplitter 30 at an angle of 45 from the plane of the page and perpendicular to the emission direction of the laser 1.

In the third example embodiment, two non-polarizing beamsplitters can be used instead of the polarizing beamsplitters 30, 33, respectively. However, in such an alternative case, some optical power would likely be lost. Referring to FIG. 6, the pulse portion that would be transmitted by a non-polarizing beamsplitter at 30 generally would not be fully transmitted by a non-polarizing beamsplitter at 33; a portion of the pulse would be reflected downward (i.e., toward the bottom of the drawing) away from the output and thus would be lost. Similarly, the pulse portion reflected by a non-polarizing beamsplitter at 30 would not be fully reflected by the non-polarizing beamsplitter at 33; the transmitted portion would continue toward the bottom of the drawing and thus would be lost.

Figure 7:
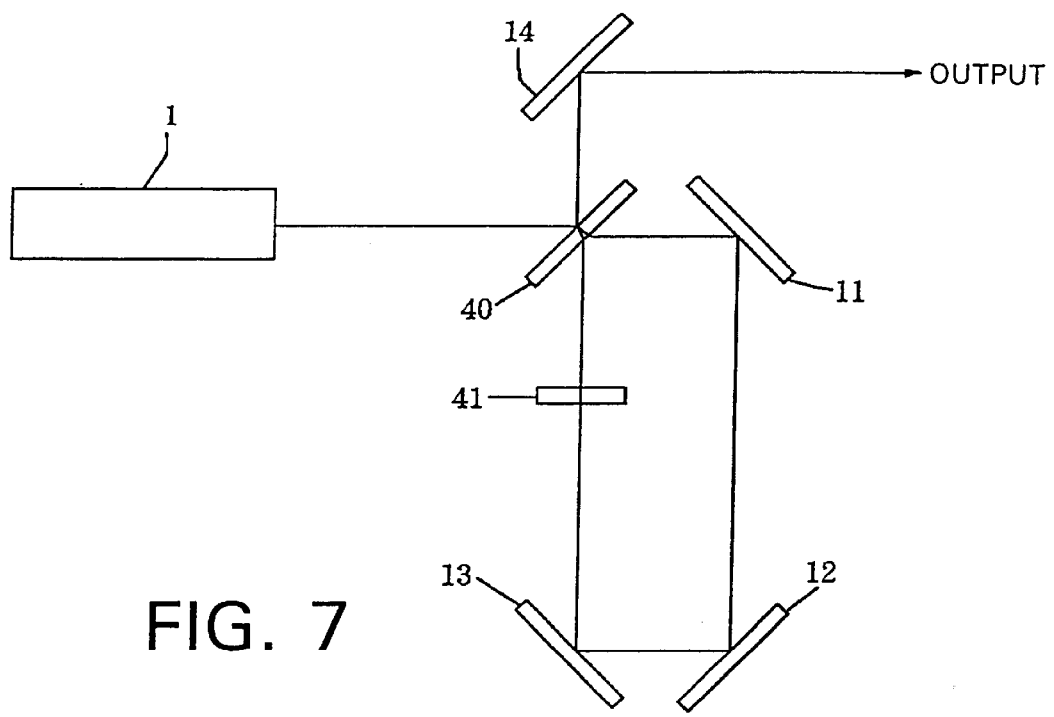
FIG. 7 is an optical block diagram of a pulse-width extending optical system according to a fourth example embodiment of the invention.

FIG. 7 is an optical block diagram of the pulse-width extending optical system according to the fourth example embodiment of this invention. The fourth example embodiment is similar to the first example embodiment, except that the fourth example embodiment has a halfwave retarder 41 in the optical path of the circulating optical system. The fourth example embodiment is explained below pointing out the differences relative to the first example embodiment.

The pulse-width extending optical system used in the FIG. 7 embodiment comprises a laser 1 that emits a nearly linearly polarized light pulse. For purposes of describing this embodiment, the direction of polarization of the laser pulses is parallel to the plane of the page of FIG. 7. Light polarized in this direction will be referred to as "p-polarized." It will be readily apparent to those skilled in the art that other polarization directions can be accommodated.

A p-polarized pulse from the laser 1 enters a dielectric beamsplitter 40 that splits the pulse into a reflected pulse and a transmitted pulse. The reflected pulse is reflected by a mirror 14 to an output. The transmitted pulse is reflected sequentially by mirrors 11, 12 before entering the halfwave retarder 41.

The halfwave retarder 41 is made of an optically anisotropic material and can rotate the orientation of linearly polarized light. Linearly polarized light, polarized at an angle with respect to the axis of a halfwave retarder, exits the halfwave retarder linearly polarized at an angle—with respect to the axis of the halfwave retarder. This is equivalent to a rotation of the direction of polarization by 2. For example, if light enters a halfwave retarder polarized at +45 degrees with respect to the axis of the retarder, then the light exits polarized at −45 degrees, or equivalently, with its polarization rotated by 90 degrees. This and other properties of halfwave retarders are well-known.

The halfwave retarder 41 is oriented so that its axis is at an angle of 45 degrees with respect to the plane of the drawing and to the path of the pulse between mirror 40 and the mirror 13. The halfwave retarder 41 therefore rotates the direction of polarization of light passing through it by 90 degrees. Thus, every pulse entering the halfwave retarder 41 as p-polarized exits as s-polarized; s-polarized pulses entering the halfwave retarder 41 similarly exit as p-polarized. Therefore, the first circulating pulse is rotated from p-polarization to s-polarization by halfwave retarder 41 before the first circulating pulse returns to the dielectric beamsplitter 40.

The dielectric beamsplitter 40 then transmits a portion of the first circulating pulse. This portion is the second output pulse. The mirror 14 reflects the second output pulse toward the output. The dielectric beamsplitter 40 reflects a portion of the first circulating pulse, forming a second circulating pulse. The mirrors 11, 12, 13 reflect the second circulating pulse, returning it to the beamsplitter 40 after the second circulating pulse passes through the halfwave retarder 41 (which changes the polarization of the pulse from s-polarization back to p-polarization).

The dielectric beamsplitter 40 transmits a portion of the second circulating pulse, forming a third output pulse. The mirror 14 reflects the third output pulse to the output. The portion of the second circulating pulse reflected by the dielectric beamsplitter 40 becomes a third circulating pulse. The third circulating pulse is reflected by the mirrors 11, 12, 13 and transmitted by the halfwave retarder 41 which changes the third circulating pulse from p-polarization to s-polarization and then returns to the dielectric beamsplitter 40.

In this way the pulses that are reflected by the dielectric beamsplitter 40 travel the same optical path via the mirrors 11, 12, 13, and the halfwave retarder 41. The light pulses reflected by the dielectric beamsplitter 40 alternate polarization between p-polarization and s-polarization. After a pulse has traveled the optical path, a portion of the pulse is transmitted to the output by the dielectric beamsplitter 40. The magnitude of a circulating pulse declines with each reflection by the dielectric beamsplitter 40 because a portion of the pulse is transmitted to the output. Eventually, the energy in the original laser pulse is delivered to the output.

The power of the circulating and output pulses depends upon the reflectivity of the dielectric beamsplitter 40. The dielectric beamsplitter 40 generally has different reflectivities for s-polarized and p-polarized pulses. For purposes of explanation, the reflectivity of the dielectric beamsplitter 40 to p-polarized pulses is $R_p$ and the reflectivity to s-polarized pulses is $R_s$. The powers $E_1$, $E_2$, and $E_3$ of the first three output pulses is given by equations (14)–(16):

$$E_1 = E \cdot R_p \quad (14)$$

$$E_2 = E \cdot (1-R_p) \cdot (1-R_p) \quad (15)$$

$$E_3 = E \cdot (1-R_p) \cdot R_s \cdot (1-R_p) \quad (16)$$

In the fourth example embodiment, the halfwave retarder 41 is placed in the optical path of the circulating optical system. The halfwave retarder 41 alternately changes the polarization of the pulses so that the power $E_1$ of the first output pulse, the power $E_2$ of the second output pulse, and the power $E_3$ of the third output pulse can be made early equal. If equations (14)–(16) are solved such that $E_1=E_2=E_3$, then the reflectivities $R_s$ and $R_p$ required may be determined.

The solution is $R_p=29.3\%$ and $R_s=58.6\%$.

With these reflectivities, the powers $E_1$, $E_2$, and $E_3$ of the first three output pulses are approximately 29.3 percent of the power E of the original laser pulse. In this way, the fourth example embodiment achieves lower peak power in the output pulses than the first example embodiment in which the powers $E_1$ and E2 of the first two output pulses are approximately 38.2 percent of the power E of the original laser pulse.

It is also possible to provide for errors in the reflectivities of the dielectric beamsplitter 40. For example, the reflectivities can be selected such that the powers $E_1$, $E_2$, and $E_3$ of the first three output pulses are 40 percent or less than the power E of the original laser pulse. Using the foregoing equations (14)–(16) to determine the magnitudes of $E_1$, $E_2$, and $E_3$, the reflectivities $R_s$ and $R_p$ must satisfy the following inequalities:

$$E \cdot R_p < 0.4E \quad (17)$$

$$E \cdot (1-R_p) \cdot (1-R_s) < 0.4E \quad (18)$$

$$E \cdot (1-R_p) \cdot R_s \cdot (1-R_p) < 0.4E \quad (19)$$

It will be readily apparent that, if the original laser pulse is s-polarized instead of p-polarized, interchanging $R_s$ and $R_p$ in expressions (14)–(19) gives the correct expression.

Figure 8:
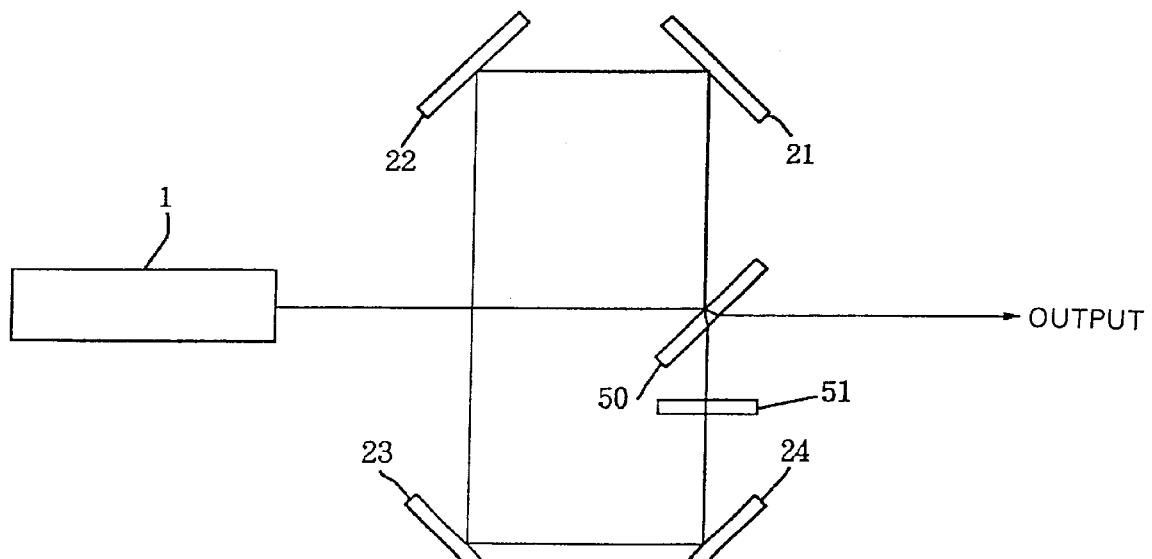
FIG. 8 is an optical block diagram of a pulse-width extending optical system according to a fifth example embodiment of the invention.

FIG. 8 is an optical block diagram of a pulse-width extending optical system according to a fifth example embodiment of the invention.

The pulse-width extending optical system of the fifth example embodiment is similar to that of the second example embodiment of FIG. 5, differing primarily in the placement of a halfwave retarder 51 in the optical path of the circulating optical system. In the fifth example embodiment, as in the fourth example embodiment, the powers $E_1$, $E_2$, and $E_3$ of the first three output pulses can be made nearly equal. The fifth example embodiment is explained below pointing out the differences relative to the second and fourth example embodiments.

A laser 1 emits a p-polarized laser pulse. As defined above, p-polarization is the polarization direction in the plane of the page of FIG. 8 and perpendicular to the direction of propagation of the laser pulse. The equations describing the magnitudes of the output pulses are readily found by substituting $T_s$ and $T_p$ for $R_s$ and $R_p$, respectively, in the equations pertaining to the fourth example embodiment. $T_s$ and $T_p$ are the transmissivities of a dielectric beamsplitter 50 for the s- and p-polarized pulses, respectively. This is apparent by noting that the first output pulse of the fifth example embodiment is transmitted by the dielectric beamsplitter 50 and subsequent output pulses are formed by reflection of circulating pulses. In contrast, in the fourth example embodiment, the first output pulse is reflected by a beamsplitter and subsequent output pulses are the transmitted portions of circulating pulses. Therefore, the powers $E_1$, $E_2$, and $E_3$ of the first three output pulses are equal if the dielectric beamsplitter 50 has transmissivities $T_p$=29.3 percent and $T_s$=58.6 percent.

It will be readily apparent that, if the original laser pulses are s-polarized, the transmissivities $T_p$ and $T_s$ of the dielectric beamsplitter 50 should be interchanged.

Figure 9:
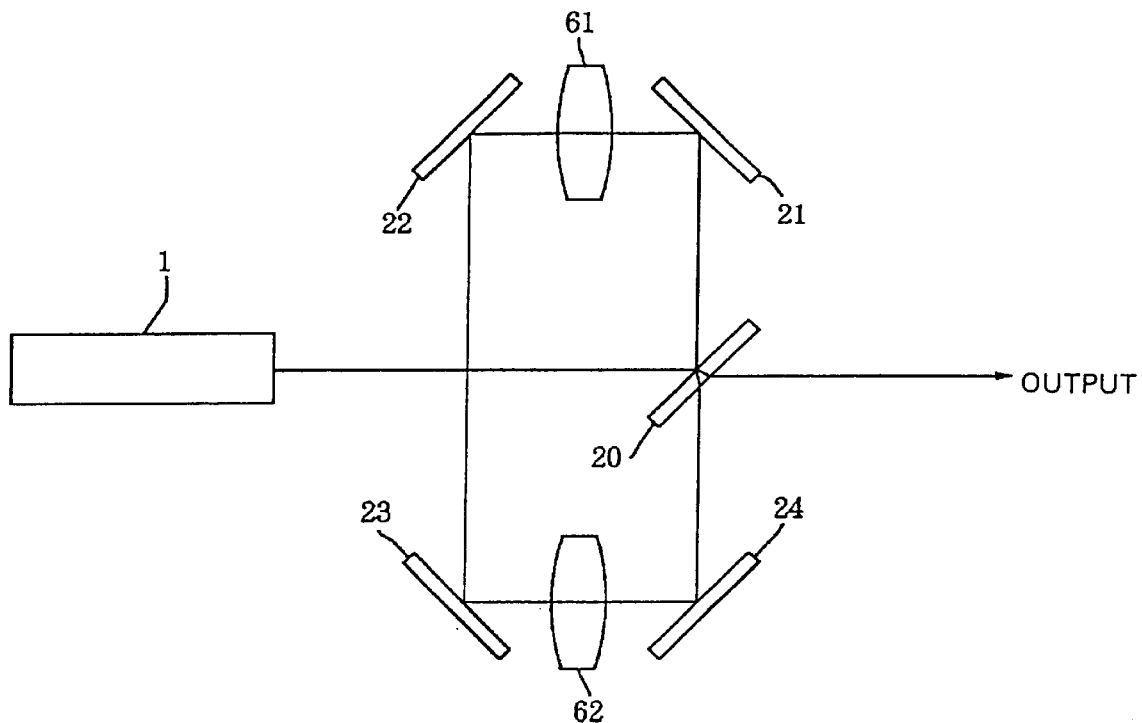
FIG. 9 is an optical block diagram of a pulse-width extending optical system according to a sixth example embodiment of the invention.

FIG. 9 is an optical block diagram of a pulse-width extending optical system according to the sixth example embodiment of the invention. The pulse-width extending optical system of the sixth example embodiment is similar to that of the second example embodiment as shown in FIG. 5, differing primarily from the second example embodiment in the placement of a relay system 61, 62 (preferably a Keplerian relay system) in the optical path of the circulating optical system. The sixth example embodiment is explained below pointing out the differences relative to the second example embodiment.

As shown in FIG. 9 the relay system 61, 62 is placed in the optical path of a circulating optical system formed by mirrors 21, 22, 23, 24. The relay system 61, 62 controls the tendency of the beam cross-section of the laser pulses to increase. As is well-known, beams of light naturally diverge. The relay system 61, 62 is arranged so that the beamsplitting surface of a dielectric beamsplitter 20 and the beam-combining surface of the dielectric beamsplitter 20 are conjugate, i.e., the beamsplitting surface and the beam combining surfaces are imaged onto each other. In general, surfaces imaged onto each other are conjugate surfaces.

When the laser 1 has a large beam divergence such as is common with excimer lasers, the circulating pulses tend to diverge and spread out as they propagate around the circulating optical system.

Figure 10:
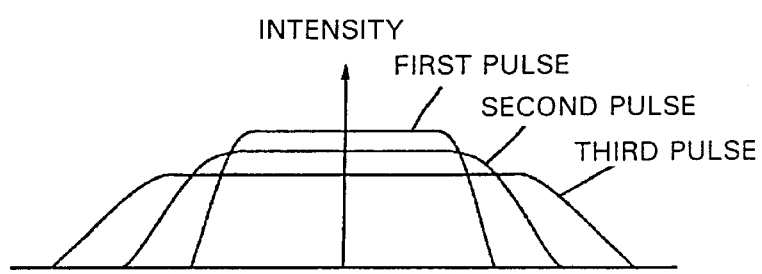
FIG. 10 is a plot of the optical beam cross-section for the delayed optical pulses of the optical system of the second example embodiment.

FIG. 10 illustrates the divergence of the circulating pulses. FIG. 10 shows the intensity of the pulses as function of a coordinate perpendicular to the propagation direction. As shown in FIG. 10, the first pulse is narrowest; the second pulse is wider than the first pulse and narrower than the third pulse. It is apparent that the cross-section of pulses gradually enlarges as the pulses propagate.

The relay system 61, 62 confines the pulses and prevents them from spreading out, regardless of the number of times they have propagated through the circulating optical system. Furthermore, the magnification of the relay system 61, 62 is set so that the first pulse of light and the second pulse of light are rotated just 180 degrees relative to each other before the beamsplitter 20 directs them to the output.

Figure 11:
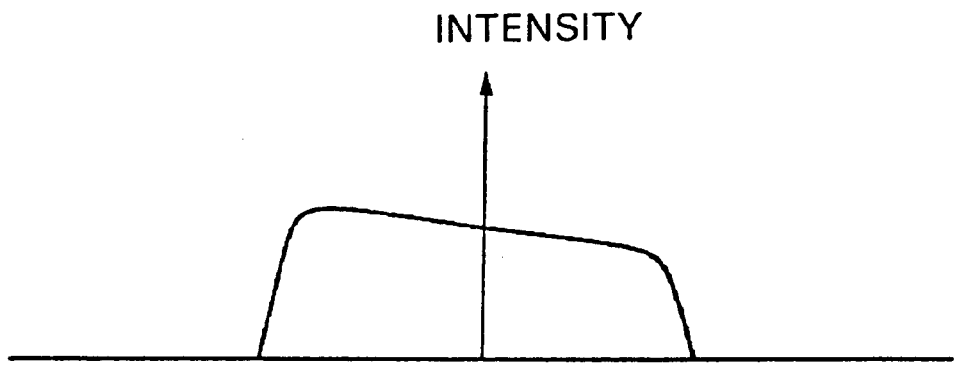
FIG. 11 is a plot of the optical beam cross-section for an asymmetric optical pulse from an excimer laser according to the sixth example embodiment.
Figure 12:
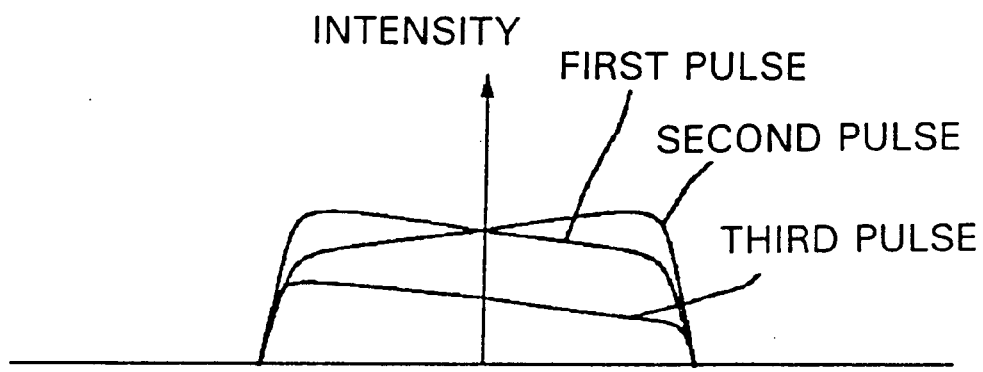
FIG. 12 is a plot of the beam cross-section of alternating delayed optical pulses showing that even-numbered pulses are inverted with respect to odd-number pulses in a delaying optical system with a relay optical system such as that of the sixth example embodiment.

As shown in FIG. 11, even if an excimer laser emits a pulse having a non-uniform cross-section, the odd-numbered pulses and the even-numbered pulses are rotated 180 degrees relative to each other and directed to the output as shown in FIG. 12. In this way, not only is beam-spreading controlled but the optical power delivered to the output is delivered with a more uniform distribution.

In the sixth example embodiment of FIG. 9, the optical path joining the laser 1 and the dielectric beamsplitter 20 crosses the optical path joining the mirrors 22 and 23. If it is undesirable to have these paths cross, crossing may be avoided by arranging the optical path formed by the mirrors 21, 22, 23, 24 and the relay system 61, 62 in a plane other than the plane of the page of FIG. 9. Furthermore, it is generally desirable that the relay system 61, 62 have a magnification of either 1 or -1. The focal point is at the mid-point of the relay system, so optical elements (such as the mirrors 21, 22, 23, 24) are preferably sufficiently distant from the focal point so that they are not damaged by the high light intensity at the focal point.

Figure 13:
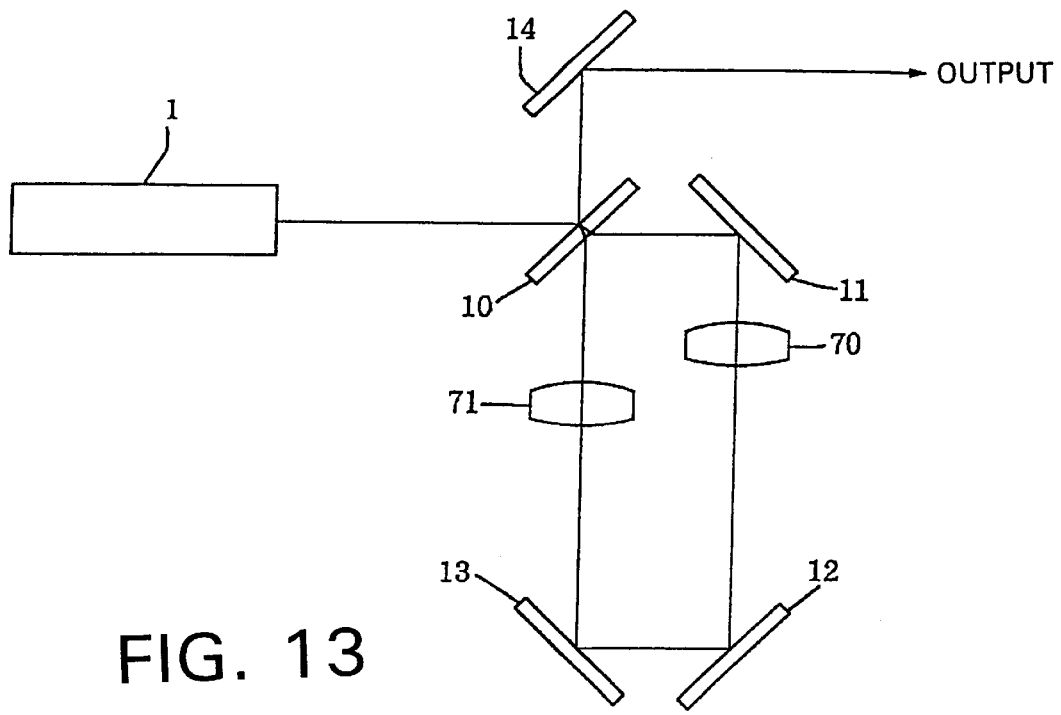
FIG. 13 is an optical block diagram of a pulse-width extending optical system according to a seventh example embodiment of the invention.

FIG. 13 is an optical block diagram of a pulse-width extending optical system according to a seventh example embodiment of the invention.

The pulse-width extending optical system used in the seventh example embodiment is similar to that of the first example embodiment of FIG. 1, differing primarily from the first example only in the placement of a relay system 71, 72 (preferably Keplerian) in the optical path of the circulating optical system. In the seventh example embodiment, as in the sixth example embodiment, the beamsplitting surface of the beamsplitter 10 and the beam combining surface are nearly conjugate by means of the relay system 71, 72 which preferably has a magnification of -1. In this example embodiment, both beam divergence and beam uniformity are improved.

Figure 14:
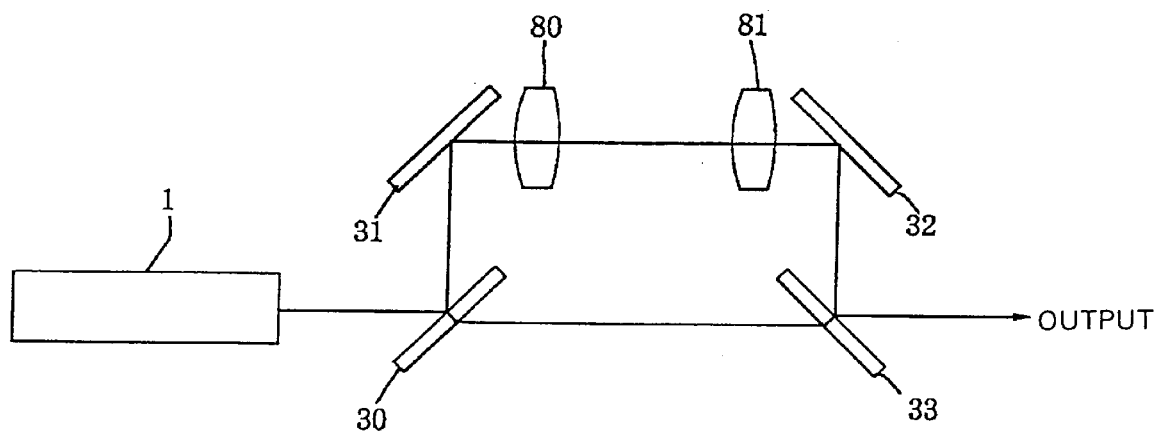
FIG. 14 is an optical block diagram of a pulse-width extending optical system according to an eighth example embodiment of the invention.

FIG. 14 is an optical block diagram of a pulse-width extending optical system according to an eighth example embodiment of the invention.

The pulse-width extending optical system of the eighth example embodiment is similar to that of the third example embodiment, differing from the third example embodiment primarily in the placement of a relay system 81, 82 (preferably Keplerian) in the longer of the two optical paths. In the eighth example embodiment, as in the sixth and seventh example embodiments, the beamsplitting surface of the first beamsplitter 30 and the directing (combining) surface of the directing component are nearly conjugate by means of the relay system 81, 82 which has a magnification of -1.

Figure 15:
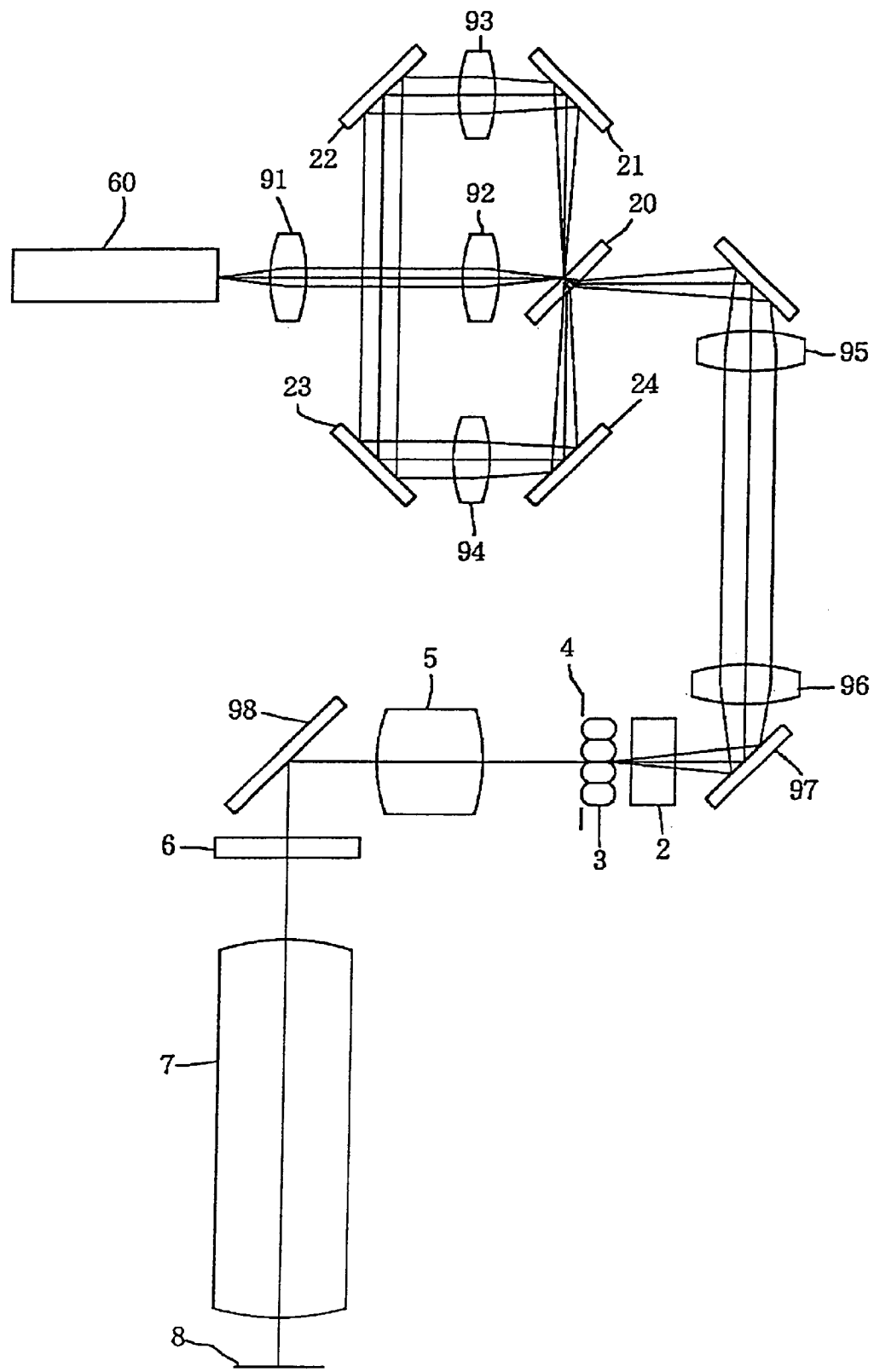
FIG. 15 is an optical block diagram of a projection-exposure apparatus comprising a pulse-width extending optical system according to a ninth example embodiment of the invention.
Figure 16:
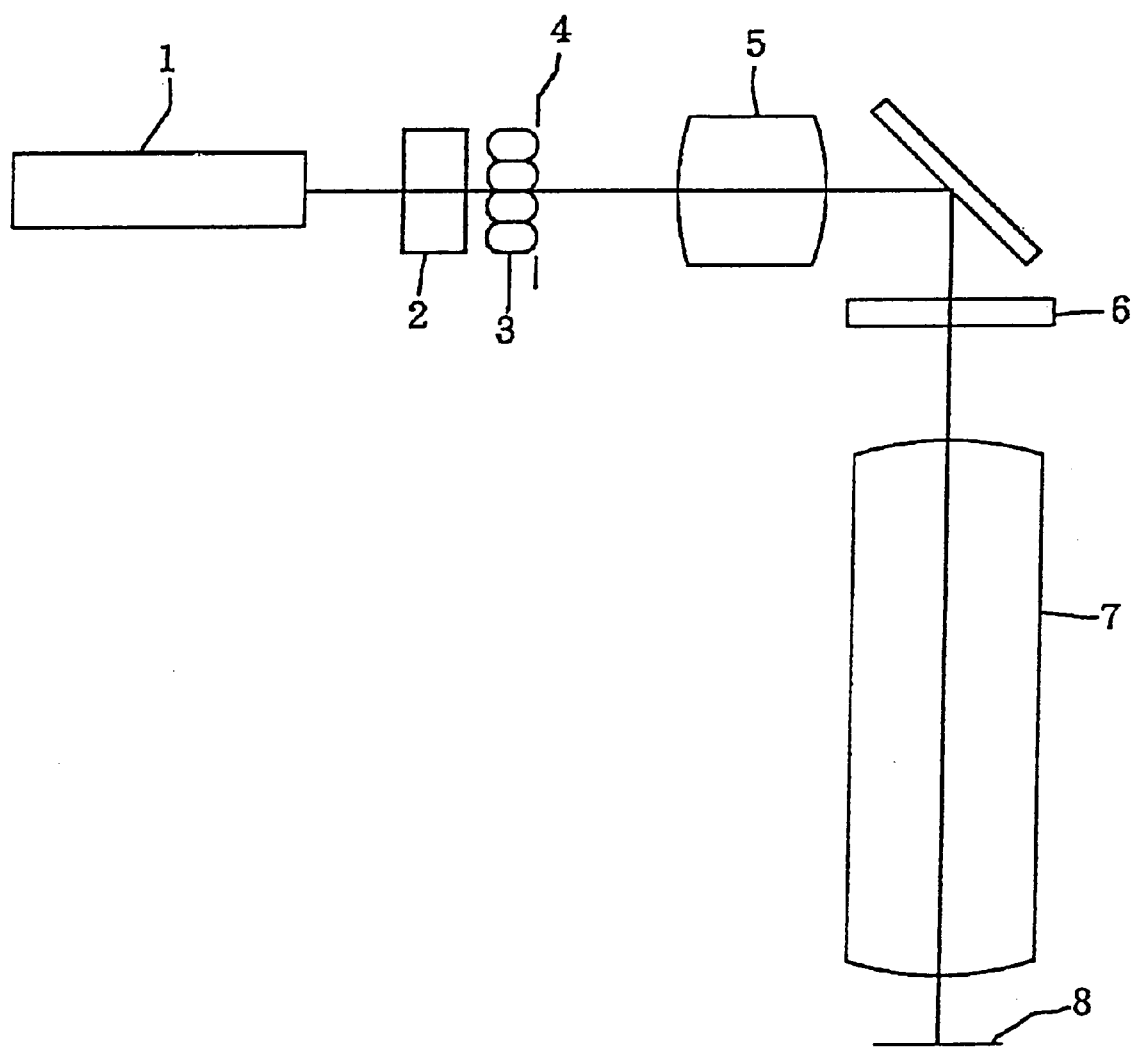
FIG. 16 is an optical block diagram of a prior-art projection-exposure apparatus employing a pulsed laser.

FIG. 15 is an optical block diagram of a projection-exposure apparatus according to a ninth example embodiment of the invention, the apparatus comprising a pulse-width extending optical system as described above.

The projection-exposure apparatus of the ninth example embodiment comprises an excimer laser 60 that emits laser pulses. The laser pulses emitted by the excimer laser 60 enter a dielectric beamsplitter 20 through a relay system 91, 92 (preferably Keplerian). The relay system 91, 92 is configured so that the output aperture of the excimer laser 60 and the beamsplitting surface of the dielectric beamsplitter 20 are nearly conjugate.

The magnification of the relay system 91, 92 depends on the size of the dielectric beamsplitter 20 and the beam cross-section of the laser emission. Even if the laser 60 emits pulses at an angle to the optical axis of the relay system 91, 92 and not along the axis, the relay system 91, 92 still guides the pulses from the laser 60 to the dielectric beamsplitter 20.

As in the pulse-width extending optical system in the sixth example embodiment shown in FIG. 9, the pulses entering the dielectric beamsplitter 20 shown in FIG. 15 are split into pulses transmitted by the dielectric beamsplitter 20 (output pulses) and pulses reflected by the dielectric beamsplitter 20 (circulating pulses). The mirrors 21, 22, 23, 24 define a circulating optical path; the circulating optical path comprises a second relay system 93, 94. The circulating return to the dielectric beamsplitter 20 after propagating around the circulating path. The circulating pulses return to the dielectric beamsplitter 20, and portions are reflected by the beamsplitter 20. The output portions are generally directed along the same optical path. The relay system 93, 94 preferably has a magnification of −1 and is configured so that the beamsplitting surface of the dielectric beamsplitter 20 (which acts as a both a splitting mechanism and an output mechanism) is conjugate to itself with respect to the circulating path, i.e., the relay system 93, 94 images the beamsplitter onto itself with a magnification of −1.

The relay system 91, 92, the dielectric beamsplitter 20, the mirrors 21, 22, 23, 24, and the relay system 93, 94 form a pulse-width extending optical system for the laser 60. The pulse-width extending optical system of the projection-exposure apparatus of FIG. 15 also prevents beam spatial divergence with the relay system 93, 94. As discussed previously, this relay system improves the spatial uniformity of the beam as well.

If the optical path length of the circulating optical system is larger than one-half the pulse length, then the pulse-width is extended and the peak power is reduced. As a result, the performance degradation of optical elements and systems following the pulse-width extending system is reduced and component life is extended.

The output pulses of this pulse-width extending system are directed along a common optical path through the dielectric beamsplitter 20 and to a third keplerian relay system 95 and 96. A mirror 97 then reflects the pulses into, for example, a beam-correcting optical system 2 comprising both cylindrical and spherical lenses. This beam-correcting optical system 2 changes the beam cross-section; typically, elliptical cross-sections are reshaped to be more nearly circular.

The corrected beam enters a fly-eye lens 3. The fly-eye lens 3, as known in the art, has multiple lens elements arranged in parallel along the optical axis of the optical system. Pulses incident to the fly-eye lens 3 are formed into several secondary images (secondary light sources) at the rear focal point of the fly-eye lens 3. (The secondary images of the incident radiation received by the fly-eye lens 3 produce more uniform irradiation.)

The beam-correcting optical system 2 is arranged so that the surface of the fly-eye lens 3 into which the radiation enters and the dielectric beamsplitter 20 are nearly conjugate. Even where there are slight angular differences between the optical axis of the illumination optical system and the exit direction of the output pulses from the dielectric beamsplitter 20, the light pulses from the beamsplitter 20 are accurately guided to the entrance surface of the fly-eye lens 3.

If a cylindrical lens is included in the beam-correcting optical system 2, as indicated in the detailed summary and drawings of U.S. patent application Ser. No. 08/603,001 (filed on Feb. 16, 1996; incorporated herein by reference), it is desirable to have the dielectric beamsplitter 20 and the entrance surface of the fly-eye lens 3 configured so that they are nearly conjugate in both horizontal and vertical directions.

Light from the multiple secondary light sources formed by the fly-eye lens 3 is limited by aperture 4 and is focused by a condenser lens 5. The condenser lens 5 directs the light to a mirror 98 that reflects the beam to a mask 6 that is thereby nearly uniformly irradiated. The mask 6 contains patterns such as those of a semiconductor integrated circuit. A projection optical system 7 projects the pattern of the mask 6 (as reduced or enlarged) onto a wafer 8 that has been coated with a resist sensitive to the radiation from the laser. Radiation from the laser exposes the resist coating on the wafer 8. After being exposed in the projection-exposure apparatus shown in FIG. 15, the wafer 8 undergoes further processing, including development and etching, in which all but the resist pattern are removed. Following the etching process, other processes such as a resist-removal process are performed to conclude the process. After the wafer 8 is fully processed, it is diced (cut into chips), bonded (wires are attached), and then packaged. The chip is then ready to use.

The foregoing example refers to the manufacture of large scale integration (LSI) semiconductor devices, but projection-exposure apparatus according to the present invention can be used in other manufacturing processes. For example, the projection-exposure apparatus can be used in the manufacture of liquid-crystal-display elements, thin-film magnetic heads, imaging elements (such as CCDs), and other semiconductor devices.

The laser 60, the pulse-width extending optical system, the relay system 95, 96, the beam-correcting optical system 2, the fly-eye lens 3, the aperture 4, the condenser lens 5, and the turning mirror 98 form an illumination system that illuminates the mask 6 spatially uniformly and with reduced peak optical power. By splitting the laser pulses into multiple pulses, the total laser power delivered to the wafer 8 is (neglecting losses) the same as the total power delivered without splitting the pulses. Splitting the laser pulses and extending the laser pulse-width reduces the peak optical power, reducing degradation of optical elements.

In the ninth example embodiment shown in FIG. 15, the beam-correcting optical system 2 is situated upstream of the fly-eye lens 3. However, the beam-correcting optical system 2 may be in other locations. As stated above, as long as the laser 60, the dielectric beamsplitter 20, and the fly-eye lens 3 are conjugate, it is possible, for example, to place the beam-correcting optical system 2 directly behind the laser 60 or in the optical path between the dielectric beamsplitter 20 and the lens 95 of the relay system 95, 96.

Whereas the invention has been described in connection with multiple example embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. A projection-exposure apparatus for projecting a pattern formed on a mask onto a sensitized substrate, the apparatus comprising:
   (a) a source of radiation operable to emit a pulse of radiation having a peak power;
   (b) a pulse-width extending optical system for extending a duration of the pulse emitted by the source of radiation whereby the peak power is reduced, the pulse-width extending optical system comprising (i) a pulse splitter operable to receive the pulse from the source of radiation and to split the pulse into multiple pulse portions, the pulse splitter comprising a pulse-splitting surface; (ii) pulse-delaying optical paths situated relative to the pulse splitter so as to receive the pulse portions and cause the pulse portions to propagate along the pulse-delaying optical paths and become relatively delayed with respect to each other; (iii) a pulse recombiner operable to receive the relatively delayed pulse portions from the pulse-delaying optical paths and to direct the relatively delayed pulse portions along a direction so as to form a pulse-width-extended pulse, the pulse recombiner comprising a pulse-directing surface; and (iv) a relay optical system situated so that the pulse-splitting surface is imaged onto the pulse-directing surface;

(c) an irradiation optical system situated so as to receive the pulse-width-extended pulse and illuminate the mask with the pulse-width-extended pulse; and (d) a projection optical system operable to receive radiation, from the pulse-width-extended pulse, transmitted through the mask and to project the received radiation so as to form an image of the mask pattern on the sensitized substrate.

2. The projection-exposure apparatus of claim 1, wherein the light pulse has a pulse width that is a time during which the light pulse has an intensity greater than one-half a maximum value of intensity, a propagation speed, and a pulse length that is a product of the pulse width and the propagation speed, and wherein the pulse-delaying optical paths are operable to delay the pulse portions, propagating along the pulse-delaying optical paths, with respect to each other by a time greater than or equal to the pulse-width.

3. The projection-exposure apparatus of claim 1, wherein the relay optical system is situated to provide a magnification of either +1 or −1.

4. The projection-exposure apparatus of claim 3, wherein the pulse splitter and the pulse recombiner comprise a beamsplitter, and the pulse-delaying optical paths comprise a pulse-circulating optical path along which the beamsplitter directs the pulse portions for propagation around the pulse-circulating optical path in which the pulse portions become relatively delayed, and from which pulse-circulating optical path the beam splitter receives the relatively delayed pulse portions for direction to the irradiation optical system.

5. The projection-exposure apparatus of claim 4, wherein the irradiation optical system comprises an optical member situated so as to receive the pulse-width extended pulse and form a plurality of light sources so as to direct radiation from the light sources to the mask.

6. The projection-exposure apparatus of claim 1, wherein the pulse splitter and the pulse recombiner comprise a beamsplitter, and the pulse-delaying optical paths comprise a pulse-circulating optical path along which the beamsplitter directs the pulse portions for propagation around the pulse-circulating optical path in which the pulse portions become relatively delayed, and from which pulse-circulating optical path the beam splitter receives the relatively delayed pulse portions for direction to the irradiation optical system.

7. The projection-exposure apparatus of claim 1, wherein the irradiation system comprises an optical member situated so as to receive the pulse-width-extended pulse and form a plurality of secondary sources, and a condenser operable to direct radiation from the secondary sources onto the mask.

8. The projection-exposure apparatus of claim 7, wherein the pulse of radiation has a pulse width that is a time during which the light pulse has an intensity greater than one-half a maximum value of intensity, a propagation speed, and a pulse length that is a product of the pulse width and the propagation speed, and wherein the pulse-delaying optical paths are operable to delay the pulse portions, propagating along the pulse-delaying optical paths, with respect to each other by a time greater than or equal to the pulse-width.

9. The projection-exposure apparatus of claim 7, wherein the relay optical system is situated to provide a magnification of either +1 or −1.

10. The projection-exposure apparatus of claim 9, wherein the pulse splitter and the pulse recombiner comprise a beamsplitter, and the pulse-delaying optical paths comprise a pulse-circulating optical path along which the beamsplitter directs the pulse portions for propagation around the pulse-circulating optical path in which the pulse portions become relatively delayed, and from which pulse-circulating optical path the beam splitter receives the relatively delayed pulse portions for direction to the irradiation optical system.

11. The projection-exposure apparatus of claim 10, wherein the optical member comprises a fly-eye lens presenting a surface for receiving the pulse-width-extended pulse, the surface of the fly-eye lens being conjugate with the pulse-directing surface.

12. In a method of manufacturing a semiconductor device in which a pattern is formed on a substrate by irradiating a pattern-defining mask with radiation pulses from a radiation source, and forming an image of the mask pattern on the substrate, an improvement comprising the steps:

(a) before the radiation pulses irradiate the mask, directing the radiation pulses into a pulse-width extending optical system, the radiation pulses each having a pulse width and a peak radiation power;

(b) passing the radiation pulses through the pulse-width extending optical system so as to produce pulse-width-extended radiation pulses each having a peak radiation power that is less than the peak radiation power of the radiation pulses from the radiation source;

(c) directing the pulse-width-extended radiation pulses to the mask;

(d) irradiating the substrate with the pulse-width-extended radiation pulses from the mask; and (e) wherein step (b) comprises passing the radiation pulses through a pulse-width extending optical system comprising (i) a pulse splitter operable to receive the radiation pulses from the radiation source and to split each of the radiation pulses into multiple pulse portions, the pulse splitter comprising a pulse-splitting surface; (ii) pulse-delaying optical paths situated relative to the pulse splitter so as to receive the pulse portions and cause the pulse portions to propagate along the pulse-delaying optical paths and become relatively delayed with respect to each other; (iii) a pulse recombiner operable to receive the relatively delayed pulse portions from pulse-delaying optical paths and to combine and direct the relatively delayed pulse portions along a direction so as to form pulse-width-extended pulses, the pulse recombiner comprising a pulse-directing surface; and (iv) a relay optical system that images the pulse-splitting surface onto the pulse-directing surface.

13. The method of claim 12, wherein step (c) further comprises forming a plurality of light sources by using an optical member that receives the pulse-width-extended pulses before the pulse-width-extended pulses are directed to the mask.

14. The method of claim 13, wherein in step (c), the optical member comprises a fly-eye lens.

15. The method of claim 12, wherein, in step (b), the pulse splitter and the pulse recombiner of the pulse-width extending optical system through which the radiation pulses are passed comprise a beamsplitter, and the pulse-delaying optical paths comprise a pulse-circulating optical path along which the beamsplitter directs the pulse portions for propagation around the pulse-circulating optical path in which the pulse portions become relatively delayed, and from which pulse-circulating optical path the beam splitter receives the relatively delayed pulse portions for direction to the mask.

16. The method of claim 12, wherein:
   each of the radiation pulses has a pulse width that is a time during which the radiation pulse has an intensity greater than one-half a maximum value of intensity, a propagation speed, and a pulse length that is a product of the pulse width and the propagation speed, and
   in step (b), the radiation pulses are passed through pulse-delaying optical paths that differ from each other by at least the pulse length such that the pulse portions propagating along the pulse-delaying optical paths are delayed with respect to each other.

17. The method of claim 12, wherein, in step (c), the relay optical system is situated to provide a magnification of either +1 or −1.

18. A projection-exposure apparatus for projecting a pattern formed on a mask onto a sensitized substrate, the apparatus comprising:
   (a) a pulse-width extending optical system that includes a pulse-splitting surface that splits a light pulse received from a light source into multiple light-pulse portions, a pulse-delaying optical path that introduces respective delays to the light-pulse portions, a pulse-directing surface that recombines the delayed light-pulse portions to form a pulse-width-extended light pulse having a power, and a relay optical system that images the pulse-splitting surface onto the pulse-directing surface; and
   (b) an exposure optical system situated and configured to receive the pulse-width-extended light pulse from the pulse-width extending optical system, direct the pulse-width-extended light pulse to the mask, and transfer the pattern from the mask to the sensitized substrate; and wherein
   (c) the delays of the multiple light-pulse portions are selected so that the power of the pulse-width-extended light pulse is reduced to decrease degradation of the exposure optical system.

19. The projection-exposure apparatus of claim 18, wherein the pulse-width-extending optical system comprises a beamsplitter situated to receive the light pulse from the light source and configured to split the light pulse into the multiple light-pulse portions, direct the multiple light-pulse portions along an optical delay path, and recombine the delayed light-pulse portions, wherein the beamsplitter has a reflectivity R such that 29.3%<R<50%.

20. The projection-exposure apparatus of claim 19, wherein:
   the beamsplitter includes a beamsplitting surface that splits the light pulse into the multiple light-pulse portions; and
   the pulse-width extending optical system comprises a re-imaging system situated and configured to image the beamsplitting surface onto the beamsplitting surface at a pre-determined magnification.

21. The projection-exposure apparatus of claim 18, wherein the pulse-width-extending optical system comprises a beamsplitter situated to receive the light pulse from the light source and configured to split the light pulse into the multiple light-pulse portions, and an optical delay path situated and configured to introduce the respective delays to each light-pulse portion and to direct the delayed light-pulse portions to the beamsplitter, the beamsplitter having transmissivity T such that 29.3%<T<50%.

22. The projection-exposure apparatus of claim 21, wherein:
   the beamsplitter comprises a beamsplitting surface situated and configured to split the light pulse into the multiple light-pulse portions; and
   the optical delay path comprises an imaging optical system situated and configured to image the beamsplitting surface onto the beamsplitting surface at a predetermined magnification.

23. The projection-exposure apparatus of claim 18, wherein the pulse-width-extending optical system comprises a polarizing beam splitter situated to receive the light pulse from the light source and configured to split the light pulse into the multiple light-pulse portions.

24. The projection-exposure apparatus of claim 23, wherein the pulse-width extending system further comprises an optical delay path situated and configured to direct the multiple light-pulse portions from the polarizing beamsplitter back to the polarizing beamsplitter, and a quarter-wave retarder situated in the optical delay path.

25. The projection-exposure apparatus of claim 24, wherein:
   the polarizing beamsplitter comprises a beamsplitting surface that splits the light pulse from the light source into the multiple light-pulse portions; and
   the optical delay path comprises an imaging optical system situated and configured to image the beamsplitting surface onto the beamsplitting surface at a predetermined magnification.

26. The projection-exposure apparatus of claim 18, wherein the exposure optical system comprises:
   an illumination system situated and configured to direct the pulse-width-extended light pulse to the mask; and
   a projection optical system situated and configured to project an image of the pattern from the mask onto the sensitized substrate.

27. The projection-exposure apparatus of claim 26, wherein the illumination system further comprises:
   a fly-eye lens situated and configured to form multiple light sources from the pulse-width-extended light pulse; and
   a condensing optical system situated and configured to direct light from the multiple light sources to the mask.

28. A method for exposing a sensitized substrate to a pattern defined by a mask, comprising:
   (a) producing a light pulse;
   (b) directing the light pulse through a pulse-width extending optical system to split the light pulse into multiple light-pulse portions and delay each light-pulse portion to produce a pulse-width-extended light pulse, the pulse-width extending optical system comprising (i) a pulse splitter operable to receive the light pulse from the radiation source and to split the light pulse into multiple pulse portions, the pulse splitter comprising a pulse-splitting surface; (ii) pulse-delaying optical paths situated relative to the pulse splitter so as to receive the pulse portions and cause the pulse portions to propagate along the pulse-delaying optical paths and become relatively delayed with respect to each other; (iii) a pulse recombiner operable to receive the relatively delayed pulse portions from the pulse-delaying optical paths and to combine and direct the relatively delayed pulse portions along a direction so as to form pulse-width-extended pulses, the pulse recombiner comprising a pulse-directing surface; and (iv) a relay optical system that images the pulse-splitting surface onto the pulse-directing surface;

(c) directing the pulse-width-extended light pulse to an exposure optical system;

(d) irradiating the pattern defined by the mask with the pulse-width-extended light pulse from the exposure optical system;

(e) imaging the pattern onto a sensitized substrate, and (f) delaying each light-pulse portion in the pulse-width extending optical system sufficiently to reduce deterioration in optical properties of the exposure optical system.

29. The method of claim 28, wherein the pulse-width extending optical system of step (b) comprises a beamsplitter and an optical delay path, the beamsplitter situated and configured to split the light pulse into the multiple light-pulse portions and to direct the light-pulse portions along the optical delay path from the beamsplitter back to the beamsplitter, the beamsplitter having a reflectivity R such that 29.3%<R<50%.

30. The method of claim 29, wherein:
the beamsplitter has a beamsplitting surface that splits the light pulse into the multiple light-pulse portions; and
the optical delay path includes an imaging optical system situated to receive the multiple light-pulse portions and configured to image the beamsplitting surface onto the beamsplitting surface at a predetermined magnification.

31. The method of claim 28, wherein the pulse-width extending optical system includes a beamsplitter situated and configured to split the light pulse into the multiple light-pulse portions and an optical delay path situated and configured to direct the multiple light-pulse portions from the beamsplitter back to the beamsplitter, the beamsplitter having a transmissivity T such that 29.3%<T<50%.

32. The method of claim 31, wherein:
the beamsplitter comprises a beamsplitting surface that splits the light pulse into the multiple light-pulse portions; and
the optical delay path includes an imaging optical system situated and configured to image the beamsplitting surface onto the beamsplitting surface at a specified magnification.

33. The method of claim 28, wherein the pulse-width extending optical system includes a polarizing beam splitter situated and configured so as to split the light pulse into the multiple light-pulse portions.

34. The method of claim 33, wherein the pulse-width extending optical system further comprises an optical delay path situated and configured to direct the light-pulse portions from the polarizing beamsplitter back to the polarizing beam splitter, the optical delay path including a quarter-wave retarder.

35. The method of claim 34, wherein:
the polarizing beam splitter includes a beamsplitting surface that splits the light pulse into the multiple light-pulse portions; and
the optical delay path includes an imaging optical system situated and configured to image the beamsplitting surface onto the beamsplitting surface at a specified magnification.

36. An exposure apparatus for transferring patterns from a mask to a substrate, comprising:

(a) a light source that generates a light pulse;

(b) a secondary light-source system situated and configured to receive the light pulse, form multiple secondary light sources, and direct light from the secondary light sources to the mask;

(c) a projection optical system situated and configured to project an image of the pattern from the mask onto a sensitized substrate; and (d) a pulse-width extending optical system situated to receive the light pulse and configured to direct the light pulse to the secondary light-source system and to extend a pulse length of the light pulse, the pulse-width extending optical system comprising (i) a pulse splitter operable to receive the light pulse from the radiation source and to split the light pulse into multiple pulse portions, the pulse splitter comprising a pulse-splitting surface; (ii) pulse-delaying optical paths situated relative to the pulse splitter so as to receive the pulse portions and cause the pulse portions to propagate along the pulse-delaying optical paths and become relatively delayed with respect to each other; (iii) a pulse recombiner operable to receive the relatively delayed pulse portions from the pulse-delaying optical paths and to combine and direct the relatively delayed pulse portions along a direction so as to form pulse-width-extended pulses, the pulse recombiner comprising a pulse-directing surface; and (iv) a relay optical system that images the pulse-splitting surface onto the pulse-directing surface.

37. The exposure apparatus of claim 36, further comprising a condenser optical system situated to receive the light from the secondary light-source system and configured to direct the light from the secondary light sources to the mask.

38. The exposure apparatus of claim 36, wherein the secondary light-source system includes a fly-eye lens.

39. The exposure apparatus of claim 36, wherein the pulse-width extending optical system comprises:
a beamsplitter that includes a beamsplitting surface that splits the light pulse into multiple light-pulse portions; and
a light guide system that directs the multiple light-pulse portions along an optical delay path to the beamsplitter, the light guide system including an imaging system situated and configured to image the beamsplitting surface onto the beamsplitting surface at a predetermined magnification.

40. The exposure apparatus of claim 36, wherein the pulse-width extending optical system comprises a beamsplitter having a reflectance R such that 29.3%<R<50%.

41. The exposure apparatus of claim 36, wherein the pulse-width extending optical system comprises a beamsplitter having a transmittance T such that 29.3%<T<50%.

42. The exposure apparatus of claim 36, wherein the pulse-width extending optical system comprises a polarizing beam splitter.

43. An exposure method for transferring a pattern from a mask to a substrate, comprising:

(a) providing a light pulse having a pulse length;

(b) extending the pulse length of the light pulse with a pulse-width extending optical system comprising (i) a pulse splitter operable to receive the light pulse from the radiation source and to split the light pulse into multiple pulse portions, the pulse splitter comprising a pulse-splitting surface; (ii) pulse-delaying optical paths situated relative to the pulse splitter so as to receive the pulse portions and cause the pulse portions to propagate along the pulse-delaying optical paths and become relatively delayed with respect to each other; (iii) a pulse recombiner operable to receive the relatively delayed pulse portions from the pulse-delaying optical paths and to combine and direct the relatively delayed pulse portions along a direction so as to form pulse-width-extended pulses, the pulse recombiner comprising a pulse-directing surface; and (iv) a relay optical system that images the pulse-splitting surface onto the pulse-directing surface;

(c) forming multiple secondary light sources from the light pulse after step (b); and (d) exposing the substrate to the pattern from the mask using the multiple secondary light sources.

44. The method of claim 43, wherein step (d) comprises:

irradiating the pattern of the mask with light from the multiple secondary sources; and projecting an image of the pattern onto the substrate.

45. The method of claim 43, wherein the multiple secondary sources are formed with a secondary light-source system that includes a fly-eye lens.

46. The method of claim 43, wherein step (b) is performed with a pulse-width extending optical system, the pulse-width extending optical system including:

a beamsplitter including a beam splitting surface that splits the light pulse into multiple light-pulse portions; and a light-guide system that directs the multiple light-pulse portions along an optical delay path to the beam splitter, the light-guide system including an imaging system situated and configured to image the beamsplitting surface onto the beamsplitting surface at a predetermined magnification.

47. The method of claim 43, wherein step (b) is performed by using a pulse-width extending optical system that includes a beamsplitter having a reflectance R such that 29.3%<R<50%.

48. The method of claim 43, wherein step (b) is performed by using a pulse-width extending optical system that includes a beamsplitter having a transmittance T such that 29.3%<T<50%.

49. The method of claim 43, wherein step (b) is performed by using a pulse-width extending optical system that includes a polarizing beamsplitter.

50. An exposure apparatus comprising:

(a) a radiation source configured to emit a pulse of radiation;

(b) an illumination optical system that is situated to receive the pulse of radiation and configured to direct the pulse of radiation to a mask;

(c) a projection optical system situated and configured to project an image of the mask onto a substrate; and (d) a pulse-width-extending optical system situated to receive the pulse of radiation and configured to produce at least two pulse portions having relative delays, the pulse-width-extending optical system including (i) a pulse splitter having either a transmittance T such that 29.3%<T<50% or a reflectance R such that 29.3%<R<50%, and (ii) a relay optical system situated to receive at least one pulse portion and configured to direct the received pulse portion from the pulse splitter back to the pulse splitter and to form an image of the pulse splitter on the pulse splitter.

51. The exposure apparatus of claim 50, wherein the relay optical system is configured to produce a magnification of +1 or −1.

52. The exposure apparatus of claim 50, wherein the illumination optical system includes an optical integrator situated to receive the pulse portions from the pulse-width-extending optical system and configured to form multiple light sources, and a condenser situated and configured to direct radiation from the multiple light sources to the mask.

53. The exposure apparatus of claim 52, wherein the optical integrator includes a multi-lens array.

54. The exposure apparatus of claim 53, wherein the multi-lens array includes a fly-eye lens.

55. The exposure apparatus of claim 50, further comprising a radiation relay optical system situated and configured to direct the pulse of radiation to the pulse-width extending-optical system.

56. A method of manufacturing a semiconductor device, comprising:

(a) providing a radiation source that emits a pulse of radiation;

(b) providing a pulse-width extending-optical system that divides the pulse of radiation into two or more pulse portions, wherein the pulse portions are relatively delayed with respect to each other, the pulse-width-extending optical system including (i) a pulse-separating surface situated to receive the pulse of radiation and having either a transmittance T such that 29.3%<T<50% or a reflectance R such that 29.3%<R<50%, and (ii) a relay optical system situated to direct a pulse portion from the pulse-separating surface back to the pulse-separating surface and that images the pulse-separating surface onto the pulse-separating surface;

(c) directing the pulse portions to a mask; and (d) projecting an image of the mask onto a substrate.

57. The method of claim 56, further comprising configuring the relay optical system to produce a magnification of either +1 or −1.

58. The method of claim 56, further comprising:

situating an optical integrator to receive the pulse portions;

and passing the pulse portions through a condenser optical system to guide the pulse portions from the optical integrator to the mask.

59. The method of claim 56, wherein the optical integrator includes a multi-lens array.

60. The method of claim 59, wherein the multi-lens array includes a fly-eye lens.

61. The method of claim 56, further comprising directing the pulse of radiation to the pulse-width-extending optical system with a radiation relay optical system.

62. An exposure apparatus comprising:

a light source unit supplying a light pulse to transfer a pattern formed on a mask onto a photosensitive substrate;

an illumination optical system arranged in an optical path between said mask and said light source unit, said illumination optical system comprising a uniform illumination unit disposed in an optical path within said illumination optical system so as to perform uniform illumination with respect to the mask; and a pulse-width extending optical system arranged in an optical path between said light source and said uniform illumination unit, which extends a duration of the light pulse supplied from said light source while decreasing a peak power of the light pulse, said pluse-width extending optical system including an optical surface having a multi-layer coating dividing the light pulse into at least two light pulses.

63. An exposure apparatus according to claim 62, wherein said pulse-width extending optical system comprises a beam dividing member disposed to divide the light pulse into multiple pulse portions, and a beam deflecting system disposed to direct at least one of the pulse portions to said beam dividing member, wherein the beam dividing member includes the optical surface having the multi-layer coating.

64. An exposure apparatus according to claim 63, wherein:
said beam dividing member comprises a pulse-splitting surface and a pulse-combining surface, and
said pulse-width extending optical system further comprises a relay optical system that images the pulse-splitting surface onto the pulse-combining surface.

65. An exposure apparatus according to claim 64, wherein said relay optical system has a magnification of either +1 or −1.

66. An exposure apparatus according to claim 65, wherein said light source unit comprises an excimer laser source.

67. An exposure apparatus according to claim 64, wherein the pulse-splitting surface and the pulse-combining surface are the same surface.

68. An exposure apparatus according to claim 64, wherein said light source unit comprises an excimer laser source.

69. An exposure apparatus according to claim 63, wherein said beam dividing member comprises a polarizing beam splitter.

70. An exposure apparatus according to claim 69, wherein said light source unit comprises an excimer laser source.

71. An exposure apparatus according to claim 63, wherein said light source unit comprises an excimer laser source.

72. An exposure apparatus according to claim 63, wherein said beam deflecting system comprises a plurality of deflecting members disposed to deflect said at least one of the pulse portions.

73. An exposure apparatus according to claim 63, wherein said pulse-width extending optical system divides said light pulse into a plurality of pulse portions to give predetermined differences between optical path lengths through which said divided pulse portions pass respectively, and said predetermined differences in the optical path lengths is larger than a product of a time period during which an emission intensity of the light pulse is larger than one-half of a peak intensity of the light pulse in the emission of said light pulse, and a velocity of light.

74. An exposure apparatus according to claim 62, wherein the uniform illumination unit comprises a fly-eye lens.

75. An exposure apparatus comprising:
a light source unit supplying a light pulse to transfer a pattern formed on a mask onto a photosensitive substrate;
an illumination optical system arranged in an optical path between said mask and said light source unit, said illumination optical system comprising a uniform illumination unit disposed in an optical path within said illumination optical system so as to perform uniform illumination with respect to the mask; and
a pulse-width extending optical system arranged in an optical path between said light source unit and said uniform illumination unit, which extends a duration of the light pulse supplied from said light source unit while decreasing a peak power of the light pulse, said pulse-width extending optical system including a polarizing beam splitter.

76. An exposure apparatus comprising:
a light source unit supplying a light pulse to transfer a pattern formed on a mask onto a photosensitive substrate;
an illumination optical system arranged in an optical path between said mask and said light source unit, said illumination optical system comprising a uniform illumination unit disposed in an optical path within said illumination optical system so as to perform uniform illumination with respect to the mask; and
a pulse-width extending optical system arranged in an optical path between said light source unit and said uniform illumination unit, which extends a duration of the light pulse supplied from said light source unit while decreasing a peak power of the light pulse, said pulse-width extending optical system including a beam converting member that changes a polarized beam condition.

77. An exposure apparatus according to claim 76, wherein said beam converting member comprises a half wavelength plate.

78. An exposure apparatus according to claim 77, wherein said pulse-width extending optical system divides said light pulse into a plurality of pulse portions to give predetermined differences between optical path lengths through which said divided pulse portions pass respectively, and said predetermined differences in the optical path lengths is larger than a product of a time period during which an emission intensity of the light pulse is larger than one-half of a peak intensity of the light pulse in the emission of said light pulse, and a velocity of light.

79. An exposure apparatus comprising:
a light source unit supplying a light pulse with energy of at least 10 mw/cm$^2$ and a pulse width $\delta$[sec] to transfer a pattern formed on a mask onto a photosensitive substrate;
an illumination optical system arranged in an optical path between said mask and said light source unit, said illumination optical system comprising a uniform illumination unit disposed in an optical path within said illumination optical system so as to perform uniform illumination with respect to the mask; and
a pulse-width extending optical system arranged in an optical path between said light source unit and said uniform illumination unit, which extends a duration of the light pulse supplied form said light source unit while decreasing a peak power of the light pulse, said pulse-width extending optical system divides the light pulse into multiple pulse portions and provides a pulse length of at least $3 \times 10^8 \times \delta$[m] with respect to said divided pulse portions.

80. A method of manufacturing a semiconductor device comprising the steps of:
supplying a light pulse;
producing pulse-width-extended radiation pulses which extend a duration of the light pulse while decreasing a peak power of the light pulse;
performing a uniform illumination with respect to a mask by using a uniform illumination unit; and
transferring a pattern formed on the mask onto a photosensitive substrate;
wherein said producing step includes a step of using an optical surface having a multi-layer coating dividing the light pulse into at least two light pulses.

81. A method according to claim 80, wherein said producing step comprises the steps of:
dividing the light pulse into multiple pulse portions by using a beam dividing member which includes the optical surface having the multi-layer coating; and
directing at least one of the pulse portions to said beam dividing member by a deflecting system.

82. A method according to claim 81, wherein said pulse portion directing step comprises the step of imaging a pulse-splitting surface of said beam dividing member onto a pulse-combining surface of said beam dividing member by using a relay optical system.

83. A method according to claim 82, wherein said relay optical system has a magnification of either +1 or −1.

84. A method according to claim 83, wherein said supplying step comprises the step of using an excimer laser.

85. A method according to claim 82, wherein the pulse-splitting surface and the pulse-combining surface are the same surface.

86. A method according to claim 82, wherein said supplying step comprises the step of using an excimer laser.

87. A method according to claim 81, wherein said beam dividing member comprises a polarizing beam splitter.

88. A method according to claim 87, wherein said supplying step comprises the step of using an excimer laser.

89. A method according to claim 81, wherein said supplying step comprises the step of using an excimer laser.

90. A method according to claim 81, wherein said producing step comprises a step of dividing said light pulse into a plurality of pulse portions and giving predetermined differences between optical path lengths through which said divided pulse portions pass respectively, wherein said predetermined differences in the optical path lengths is larger than a product of a time period during which an emission intensity of the light pulse is larger than one-half of a peak intensity of the light pulse in the emission of said light pulse, and a velocity of light.

91. A method according to claim 80, wherein said supplying step comprises the step of using an excimer laser.

92. A method of manufacturing a semiconductor device comprising the steps of:
supplying a light pulse;
producing pulse-width-extended radiation pulses which extend a duration of the light pulse while decreasing a peak power of the light pulse;
performing a uniform illumination with respect to a mask by using a uniform illumination unit; and
transferring a pattern formed on the mask onto a photosensitive substrate;
wherein said producing step includes the step of using a polarizing beam splitter.

93. A method according to claim 92, wherein said producing step comprises a step of dividing said light pulse into a plurality of pulse portions and giving predetermined differences between optical path lengths through which said divided pulse portions pass respectively, wherein said predetermined differences in the optical path lengths is larger than a product of a time period during which an emission intensity of the light pulse is larger than one-half of a peak intensity of the light pulse in the emission of said light pulse, and a velocity of light.

94. A method of manufacturing a semiconductor device comprising the steps of:
supplying a light pulse;
producing pulse-width-extended radiation pulses which extend a duration of the light pulse while decreasing a peak power of the light pulse;
performing a uniform illumination with respect to a mask by using a uniform illumination unit; and
transferring a pattern formed on the mask onto a photosensitive substrate;
wherein said producing step includes the step of using a beam converting member that changes a polarized beam condition.

95. A method according to claim 94, wherein said beam converting member includes a half wavelength plate.

96. A method of manufacturing a semiconductor device comprising the steps of:
supplying a light pulse with energy of at least 10 mw/cm$^2$ and a pulse width $\delta$[sec];
producing pulse-width-extended radiation pulses which extend a duration of the light pulse while decreasing a peak power of the light pulse;
performing a uniform illumination with respect to a mask by using a uniform illumination unit; and
transferring a pattern formed on the mask onto a photosensitive substrate;
wherein said producing step comprises the steps of:
dividing the light pulse into multiple pulse portions; and
providing a pluse length of at least $3\times10^8\times\delta$[m] with respect to said divided pulse portions.

97. An exposure apparatus comprising:
an excimer laser source supplying a light pulse to transfer a pattern formed on a mask onto a photosensitive substrate;
an illumination optical system arranged in an optical path between said mask and said excimer laser source; and
a pulse-width extending optical system arranged in an optical path between said excimer laser source and said illumination optical system, which extends a duration of the light pulse supplied from said excimer laser source while decreasing a peak power of the light pulse, wherein said pulse-width extending optical system includes a light split member having a light split surface with a reflectance R such that 29.3%<R<50% or a transmittance T such that 29.3%<T<50%.

98. An exposure apparatus according to claim 97, further comprising a projection optical system disposed in an optical path between the mask and the photosensitive substrate so as to project an image of a pattern formed on the mask onto the photosensitive substrate.

99. A method of manufacturing a semiconductor device comprising the steps of:
supplying a light pulse by using an excimer laser source;
producing pulse-width-extended radiation pulses which extend a duration of the light pulse while decreasing a peak power of the light pulse, said producing step including a step of using a light split member having a light split surface with a reflectance R such that 29.3%<R<50% or a transmittance T such that 29.3%<T<50%;
directing the pulse-width-extended radiation pulses to a mask; and
transferring a pattern formed on the mask onto a photosensitive substrate.

100. An exposure apparatus comprising:
a light source supplying a light pulse;
an exposure optical system arranged in an optical path between said light source and a photosensitive substrate so as to transfer a pattern formed on a mask onto the photosensitive substrate, said exposure optical system comprising a plurality of refractive optical elements which are made from at least one of fused silica and fluorite; and a pulse-width extending optical system arranged in an optical path between said light source and said exposure optical system, which extends a duration of the light pulse supplied from said light source while decreasing a peak power of the light pulse so as to maintain an optical performance with respect to said plurality of refractive optical elements.

101. An exposure apparatus according to claim 100, wherein said light source includes an excimer laser source.

102. An exposure apparatus according to claim 100, wherein said exposure optical system comprises an illumination optical system disposed in an optical path between said light source and the mask so as to illuminate the mask, and a projection optical system disposed in an optical path between the mask and the photosensitive substrate.

103. An exposure apparatus according to claim 100, wherein each of said plurality of refractive optical elements includes an anti-reflection coating.

104. An exposure apparatus according to claim 100, wherein said pulse-width extending optical system includes a light split member having a light split surface with a reflectance R such that 29.3%<R<50% or a transmittance T such that 29.3%<T<50%.

105. An exposure apparatus according to claim 100, further comprising a projection optical system disposed in an optical path between the mask and the photosensitive substrate so as to project an image of a pattern formed on the mask onto the photosensitive substrate.

106. A method of manufacturing a semiconductor device comprising the steps of:

supplying a light pulse;

transferring a pattern formed on a mask onto a photosensitive substrate by using the light pulse passing through an exposure optical system comprising a plurality of refractive optical elements which are made from at least one of fused silica and fluorite; and producing pulse-width-extended radiation pulses which extend a duration of the light pulse while decreasing a peak power of the light pulse so as to maintain an optical performance with respect to said plurality of refractive optical elements before said transferring step.

107. A method according to claim 106, wherein said light pulse is supplied from an excimer laser source.

108. A method according to claim 106, wherein each of said plurality of refractive optical elements includes an anti-reflection coating.

109. A method according to claim 106, wherein said producing step includes a step of using a light split member having a light split surface with a reflectance R such that 29.3%<R<50% or a transmittance T such that 29.3%<T<50%.

* * * * *